United States Patent
Jeong et al.

(10) Patent No.: US 10,905,036 B2
(45) Date of Patent: Jan. 26, 2021

(54) DISPLAY COOLER AND DISPLAY DEVICE USING SAME

(71) Applicant: LG ELECTRONICS INC., Seoul (KR)

(72) Inventors: Min Woo Jeong, Seoul (KR); Han Choon Lee, Seoul (KR); Se Hyeon Kim, Seoul (KR); Sung Wook Han, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/338,115

(22) PCT Filed: Feb. 23, 2017

(86) PCT No.: PCT/KR2017/002023
§ 371 (c)(1),
(2) Date: Mar. 29, 2019

(87) PCT Pub. No.: WO2018/062645
PCT Pub. Date: Apr. 5, 2018

(65) Prior Publication Data
US 2020/0029460 A1    Jan. 23, 2020

(30) Foreign Application Priority Data

Sep. 30, 2016  (KR) .................. 10-2016-0126587
Sep. 30, 2016  (KR) .................. 10-2016-0126588

(51) Int. Cl.
*H05K 7/20*    (2006.01)

(52) U.S. Cl.
CPC ....... *H05K 7/2099* (2013.01); *H05K 7/20145* (2013.01); *H05K 7/20172* (2013.01);
(Continued)

(58) Field of Classification Search
None
See application file for complete search history.

(56) References Cited

U.S. PATENT DOCUMENTS

| 7,155,914 B2 * | 1/2007 | Ishinabe ................. F25B 21/02 |
| | | 257/E23.099 |
| 7,561,426 B2 | 7/2009 | Jeong |

(Continued)

FOREIGN PATENT DOCUMENTS

| KR | 10-2006-0108168 | 10/2006 |
| KR | 10-2010-0077618 | 7/2010 |

(Continued)

OTHER PUBLICATIONS

International Search Report dated May 23, 2017 issued in Application No. PCT/KR2017/002023.

*Primary Examiner* — Courtney L Smith
(74) *Attorney, Agent, or Firm* — KED & Associates, LLP

(57) ABSTRACT

The present invention relates to: a cooler capable of simplifying a structure, increasing heat exchange efficiency, and slimming a display device; and a display device using the same. A cooler structure applied to the display device uses a heat pipe allowing a refrigerant, which is a volatile liquid, to flow therein and a fin structure expanding a heat transfer cross section, so as to rapidly absorb, through evaporation of the refrigerant, heat from the air in a closed air circulation path circulating around a display unit, and quickly dissipate heat from an outside space (an open air circulation path) of the closed air circulation path through condensation of the refrigerant, thereby enabling heat exchange to occur very efficiently while occupying less volume. Additionally, the present invention provides the cooler structure in which the heat pipe is made in a circular fashion such that the refrigerant efficiently flows therein. Particularly, when a section in (Continued)

which the heat pipe generates heat is disposed on the side of the display unit, the display device can be formed to be just as slim.

15 Claims, 17 Drawing Sheets

(52) U.S. Cl.
CPC ..... *H05K 7/20309* (2013.01); *H05K 7/20318* (2013.01); *H05K 7/20336* (2013.01); *H05K 7/20972* (2013.01)

(56) References Cited

U.S. PATENT DOCUMENTS

| | | | | |
|---|---|---|---|---|
| 8,248,784 | B2* | 8/2012 | Nakamichi | H05K 7/20972 361/679.46 |
| 9,414,516 | B2* | 8/2016 | Chin | H05K 7/20145 |
| 9,894,800 | B2* | 2/2018 | Dunn | G02F 1/133603 |
| 10,405,456 | B2* | 9/2019 | Jang | G09F 9/30 |
| 10,485,147 | B2* | 11/2019 | Oh | G02F 1/133504 |
| 2006/0227507 | A1 | 10/2006 | Jeong | |
| 2010/0079954 | A1* | 4/2010 | Nakamichi | G02F 1/133308 361/701 |
| 2011/0051071 | A1* | 3/2011 | Nakamichi | G06F 1/1601 349/161 |
| 2012/0024509 | A1* | 2/2012 | Ueno | F28D 1/05383 165/173 |
| 2014/0321055 | A1 | 10/2014 | Yoon et al. | |
| 2015/0009627 | A1* | 1/2015 | Dunn | G02F 1/133382 361/697 |
| 2016/0198589 | A1* | 7/2016 | Kang | G02F 1/133385 361/692 |
| 2017/0023823 | A1* | 1/2017 | Dunn | G02F 1/133382 |
| 2018/0310439 | A1* | 10/2018 | Oh | H05K 7/20136 |

FOREIGN PATENT DOCUMENTS

| | | |
|---|---|---|
| KR | 10-2011-0016292 | 2/2011 |
| KR | 10-2014-0126912 | 11/2014 |

* cited by examiner

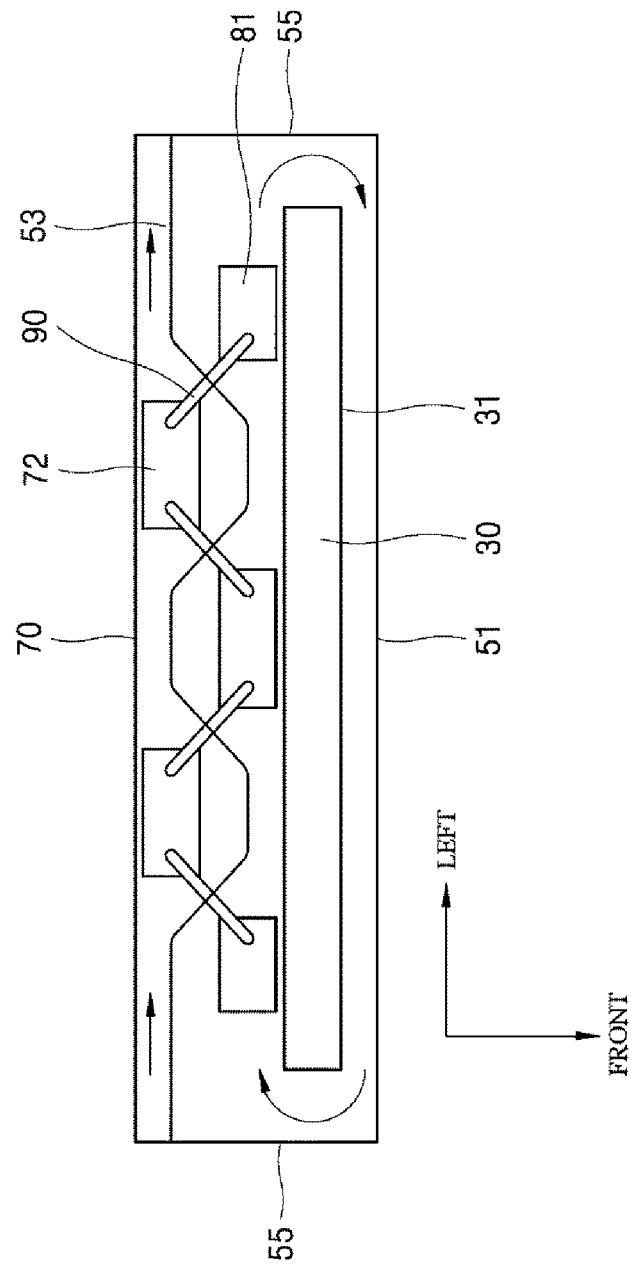

DISPLAY COOLER AND DISPLAY DEVICE USING SAME

CROSS-REFERENCE TO RELATED PATENT APPLICATIONS

This application is a U.S. National Stage Application under 35 U.S.C. § 371 of PCT Application No. PCT/KR2017/002023, filed Feb. 23, 2017, which claims priority to Korean Patent Application No's. 10-2016-0126587 filed Sep. 30, 2016 and 10-2016-0126588 filed Sep. 30, 2016, whose entire disclosures are hereby incorporated by reference.

TECHNICAL FIELD

A cooler used for a display device, and more particularly, a cooler capable of simplifying a structure of the display device, enhancing heat exchange efficiency of the cooler and enabling a display device to have a slim shape, and a display device using such a cooler is disclosed herein.

BACKGROUND ART

Liquid crystal displays (LCDs) and organic light emitting diodes (OLEDs), which are widely used as displays, may be manufactured in a shape of a flat panel and in a larger size. When a temperature of the display increases, a malfunction of the display may occur and an error of the display, in which a screen of the display is not outputted, may occur. Therefore, the display is cooled during operation of the display.

The temperature of the display is increased due to a temperature of a surrounding environment. For example, as the surrounding environment is brighter, the display becomes brighter so that the temperature of the display is increased. Particularly, as the display is manufactured in the larger size, efficient cooling of the display is more urgently required.

In view of the above, in the related art, a cooling structure was used for the display device to make an air circulation pathway where air circulates through a front surface and a rear surface of the display and to discharge heat of the display into an outside of the display as the air circulates along the pathway. The circulating air passes through heat exchanger to discharge the heat of the display into the outside of the display.

As the above-mentioned circulating air passes through the front surface of the display, if the circulating air is mixed with outside air during the cooling of the display, there is a problem that foreign matters enter the front surface of the display. Therefore, the above-mentioned air is made to circulate through an isolated state from the outside air so as not to be mixed with the outside air. The heat of the heat exchanger is discharged from the heat exchanger to the outside of the display by heat conduction to prevent the circulating air from being mixed with the air outside of the display. A cross-sectional area of a portion in which the heat is conducted may be greater to increase a heat conductivity of the heat exchanger.

In view of the above, according to the related art, the heat exchanger is installed in a display device, generally installed in a rear space of the display. As the area of the display is greater, it is possible to install a heat exchanger that has a larger area in the rear space of the display. It is not a bad choice to install the heat exchanger rearward of the display only from a viewpoint of increasing the heat conductivity of the heat exchanger.

However, according to the related art, the structure of such a heat exchanger is complicated because the heat exchanger may be installed at a position different from another position of various types of boards or related parts provided rearward of the display, and it is very difficult to design or manufacture the heat exchanger suitable for a curved display.

Particularly, when the heat exchanger is arranged rearward of the display, the thickness of the display device is greater as the heat exchanger has a certain thickness. Thus, it is difficult to design a slim display device.

In addition, according to the related art, in the heat exchanger, the air circulating between the front surface and the rear surface of the display contacts the outside air with a partition between the air circulating between the front surface and the rear surface of the display and the outside air and the heat of the air circulating between the front surface and the rear surface of the display is discharged into the outside of the partition by heat conduction made through the partition. According to the related art, as the heat exchanger has a structure in which heat of a high-temperature air may be exchanged with heat of a low-temperature air by conduction, with the partition between the high-temperature air and the low-temperature air, an area of the partition may be wide and the thickness of the partition may be less, and the partition may be made of a material having high heat conductivity.

Therefore, according to the related art, the heat exchanger has a very complicated structure. A volume of the heat exchanger may be greater to enhance the heat exchange efficiency of the heat exchanger.

DISCLOSURE

Technical Problem

The present disclosure solves the problems in the prior art described above. The present disclosure provides a cooler that uses a heat exchanger including a heat pipe that may have an effect of heat absorption generated when refrigerant is evaporated and heat generated when the refrigerant is condensed to simplify a structure of the cooler and occupy a less space and has an enhanced heat exchange efficiency of the cooler, and a slim or compact display device using such a cooler.

The present disclosure also provides a cooling module and a cooler so that a thickness of a display device is not increased due to a cooling structure of the cooling module and the cooler.

The present disclosure further provides a cooling structure that may be used to more intensively cool a region where a large amount of heat is generated.

The present disclosure provides a cooling structure for a display device in which maintenance of a fan to generate an air flow is simple.

Technical Solution

The present disclosure solves the above-described problems. According to the present disclosure, a display device has a structure of a cooler that uses a structure of a heat pipe where refrigerant as volatile liquid flows through an inside of the heat pipe and a structure of a pin that enables enlarging a heat transfer area of the heat pipe, to quickly absorb heat into it from air in a closed air circulation pathway where air circulates around a display unit by evaporating the refrigerant, and quickly discharge the heat into a space outside of the closed air circulation pathway (an open air flow pathway) by condensing the refrigerant, to occupy a less volume and generate an effective heat exchange of a heat exchanger.

Particularly, when a section where the heat is generated from the heat pipe is arranged at a side of the display unit, the slim display device may be configured.

In addition, even when the section where the heat is generated from the heat pipe is arranged at the rear of the closed air circulation pathway, the slim display device may be configured by separating arranging the pins and appropriately changing the air flow pathway.

More specifically, the present disclosure provides a cooler for a display device including a closed air circulation pathway where air circulates through a front, a rear, and a side of a display unit; an open air flow pathway where air flows adjacent to the closed air circulation pathway; a heat pipe arranged across the closed air circulation pathway and the open air flow pathway; and a first pin that is provided in the closed air circulation pathway and contacts the air that circulates through the path, and contacts the heat pipe that is disposed in the closed air circulation pathway. Further, the cooler for the display device further includes a second pin that is provided in the open air flow pathway, and the second pin may contact the heat pipe that is disposed in the open air flow pathway.

According to the above, the air that absorbs the heat of the display unit and circulates around the display unit is quickly cooled and the heat of the air is absorbed into the heat pipe, and the heat absorbed into the heat pipe is quickly transferred to and discharged into the open air flow pathway by rapid conduction of the heat pipe, thereby having an enhanced cooling effect of the cooler for the display unit. That is, according to the present disclosure, as the refrigerant in the heat pipe is changed from liquid to gas or gas to liquid during the heat exchange between gas (air in the closed air circulation pathway) and the gas (air in the open air flow pathway), the significant heat exchange between the gas (air in the closed air circulation pathway) and the gas (air in the open air flow pathway) is made to have a significantly enhanced cooling effect of the display.

A circulation fan that provides the air circulation along the closed air circulation pathway may be arranged at the side space or the rear space of the display unit to provide the air circulation without covering the display surface. Particularly, when the first pin is arranged adjacent to a discharge of the circulating fan, turbulent air discharged from the discharge more significantly exchanges heat with the first pin.

The air may flow through the open air flow pathway by a flow fan provided at a position spaced apart from the heat pipe arranged in the open air flow pathway. Accordingly, as the flow fan is arranged in a space separate from the structure of the heat exchanger, the maintenance of the fan is easy and the structure of the heat exchanger may be further simplified. Particularly, when a second pin is arranged adjacent to the discharge of the flow fan, the turbulent air discharged from the discharge more significantly exchanges heat with the second pin.

The open air flow pathway includes a section where the air flows along the side of the display unit, thereby reducing a dimension of the front-rear direction of the display device, and enabling a slim design of the display unit.

The open air flow pathway where the air flows along the side of the display unit may be arranged in the area surrounded by the closed air circulation pathway or may be arranged outside of the area surrounded by the closed air circulation pathway. In addition, the open air flow pathway that the air flows along the side of the display unit may be arranged in an alternative manner with the closed air circulation pathway to have a heat exchange area, and the heat exchange may be made using the heat pipe. In other words, any design may be applied to the present disclosure, thereby providing a high degree of design freedom of the cooler for the display device.

A duct is provided at the side of the display unit, and the air that flows through the open air flow pathway flows into a flow pathway provided by the duct to prevent the structures of the second pin and the heat pipe from being exposed to the outside thereof, and the air that flows through the open air flow pathway concentrically flows into the second pin and the heat pipe.

The open air flow pathway may include a pathway where the air flows through the rear space of the display unit and the rear space of the closed air circulation pathway. That is, according to the present disclosure, the position where the second pin and the heat pipe are provided in the structure of the cooler is not necessarily limited to the side of the display unit, and may be provided at various types of positions. Even though the open air flow pathway is provided at the rear space of the display unit, arranging the first pin not to be overlapped with the second pin in a thickness direction (forward and rearward directions) of the display device enables the thickness of the display device to not be increased or minimizing an increase in thickness of the display device. The heat pipe may be arranged at a part of the closed air flow pathway and the heat pipe may also be arranged at a part of the open air circulation pathway so that the position in which the first pin is fixed to the heat pipe is not overlapped with the position in which the second pin is fixed to the heat pipe. This arrangement is clearly different from the structure of the heat exchanger in the related art.

The first pin may have a planar shape parallel to an air flow direction of the closed air circulation pathway and may include a structure in which a plurality of first pins are spaced apart from one another in a direction perpendicular to the air flow direction. The second pin may have a planar shape parallel to an air flow direction of the open air flow pathway and may include a structure in which a plurality of second pins are spaced apart from one another in a direction perpendicular to the air flow direction, so that the air flow may be smoothly performed in each path, and the heat exchange between the pins and the air may be more smoothly performed.

At least one of a part arranged in the closed air circulation pathway or a part arranged in the open air flow pathway, in the plurality of heat pipes, may be fixed to the plurality of first pins or a plurality of second pins. For example, when a plurality of heat pipes arranged at predetermined intervals in parallel with the closed air circulation pathway are fixed to the plurality of first pins, which are spaced apart from one another and are arranged through the plurality of first pins, the heat pipes and the pins are very firmly fixed, thereby enhancing an overall structural rigidity of the heat exchanger. The second pin is fixed to the heat pipe arranged in the open air flow pathway as described above. In addition, when both ends of the heat pipe are fixed to the first pins and the second pins as described above, the rigidity of the heat exchanger is enhanced.

The plurality of heat pipes may be fixed to the plurality of pins in any one of the portion arranged in the closed air circulation pathway or a portion arranged in the open air flow pathway, in the plurality of heat pipes. The plurality of heat pipes may be fixed to the plurality of pins, respectively, in the other one of the portion arranged in the closed air circulation pathway or a portion arranged in the open air flow pathway, in the plurality of heat pipes.

In addition, a longitudinal direction of the heat pipe is substantially parallel to the pin at the portion where the heat pipe and the pin are fixed, respectively, and the heat pipe and the pin may continuously contact each other along the longitudinal direction of the heat pipe.

In other words, the rigidity of the heat exchanger is provided through coupling between the plurality of heat pipes and pins, and a contact area between the heat pipe and the pins is provided in the remaining pathway to enhance the heat exchange efficiency of the heat exchanger, and to manufacture the heat exchange firmly. In addition, the heat exchanger that has a structure in which the plurality of heat pipes and the plurality of pins are fixed to one another, respectively, is easy to modularize the components, which may lead to simplification of a process of manufacturing the display.

The present disclosure provides a display device including: a display that has a display surface; a housing that has the display unit and includes an external communicator in an open air flow pathway; a front plate arranged at a front space of the display surface and is spaced apart from the display surface and defines a part of a closed air circulation pathway; a closed air circulation pathway where air circulates through a space between the display surface and the front plate, a space of a side of the display unit, and a rear of the display unit; an open air flow pathway arranged adjacent to the closed air circulation pathway and communicates with the external communicator of the housing; and a heat exchanger including a heat pipe in which a refrigerant is evaporated by contacting the air circulating through the closed air circulation pathway and absorbing the heat and a refrigerant is condensed by discharging the heat into the air that flows through the open air flow pathway. That is, according to the present disclosure, the liquid is changed to the gas and the gas is changed to the liquid in the heat pipe in the display device so that the heat exchange significantly occurs between the liquid and gas in the heat pipe.

The open air flow pathway includes a pathway where the air circulates along the duct provided at the side of the display unit, thereby providing a concentration in which the air flows through the open air flow pathway and the slim device.

The open air flow pathway includes a pathway where the air circulates at rear space of the display unit and the rear space of the closed air circulation pathway, so that the structure of the heat exchanger may be simply designed and the slim device may be provided.

In addition, a circuit board that controls the display unit may be provided in the open air flow pathway, so that the cooling of the display unit preformed be smoothly made by continuously supplying fresh air, and the cooling of the air that circulates through the closed air circulation pathway may be concentrated on the display unit.

The heat pipe disposed in the closed air circulation pathway may contact the first pin provided in the closed air circulation pathway to promote heat absorption and evaporation of the refrigerant in the heat pipe.

The heat pipe disposed in the open air flow pathway may contact the second pin provided in the open air flow pathway to promote the heat generation and condensation of the refrigerant in the heat pipe.

In order to solve the above-mentioned problems, according to the present disclosure, the display device has the structure of the pin to increase a heat transfer area between the heat pipe in which the refrigerant flows through the inside of the heat pipe and the air, and the display device has the structure of the cooler so that the heat pipe is made in a circulating manner and the refrigerant effectively flows through the heat pipe.

In particular, the section where the circulating heat pipe absorbs the heat, the circulating heat pipe extends vertically and the refrigerant evaporated by absorbing the heat may be easily moved upward by buoyancy, and the heat pipe extends vertically in a section where the heat is discharged and the refrigerant condensed by discharging the heat may be easily moved downward by the weight of the refrigerant, generating a greater force to circulate the refrigerant in the heat pipe and enhancing the efficiency of the heat exchange of the heat pipe.

In particular, when the circulating heat pipe contacts the first pin in a section where the refrigerant in the circulating heat pipe is evaporated, and the circulating heat pipe contacts the second pin in a section where the refrigerant in the circulating heat pipe is condensed, the heat exchange between the heat pipe and the air is smoothly made through a structure in which the air circulates and flows, thereby further enhancing a cooling effect of the display.

Particularly, when the section where the heat is generated from the circulating heat pipe is arranged in side space of the display unit, the display device may be made to have a slim form.

More specifically, the present disclosure provides a cooler for a display device, including a closed air circulation pathway where air circulates along a front, a rear, and a side of a display unit; an open air flow pathway that air flows adjacent to the closed air circulation pathway; a first pin provided in the closed air circulation pathway; a second pin provided in the open air flow pathway; and a circulation heat pipe that includes an evaporation section that includes a vertically extending part and contacts the first pin on at least one section of the evaporation section, a gas-phase section that extends from the evaporation section to the open air flow pathway, a condensation section that includes a vertically extending part and contacts the second pin on at least one section of the condensation section, and a liquid-phase section that extends from the condensation section to the closed air circulation pathway.

According to this configuration, the circulating heat pipe absorbs the heat of the air circulating through the closed air circulation pathway, in the evaporation section in contact with the first fin, to cool the air in the closed air circulation pathway. The refrigerant in the heat pipe is evaporated and moves upward by the buoyancy to promote the circulation of the refrigerant in the heat pipe. In the circulating heat pipe, the heat is discharged into the air that flows through the open air flow pathway in the condensation section in contact with the second pin and the refrigerant in the heat pipe is condensed and the refrigerant in the heat pipe is condensed and descends by the weight of the refrigerant, thereby promoting the circulation of the refrigerant in the heat pipe.

That is, according to the present disclosure, the refrigerant is changed from liquid gas and from gas to the liquid during the heat exchange between liquid and gas to significantly enhance the heat exchange efficiency between the air and the refrigerant and promote the circulation of the refrigerant in the heat pipe, so that the heat exchange, of the heat exchanger, between liquid and gas is made more significantly and the cooling effect of the display device is significantly enhanced.

The circulation fan that provides the air circulation in the closed air circulation pathway may be arranged at the rear space of the display unit without covering the display surface, to provide the air circulation through the closed air circulation pathway.

The open air flow pathway includes a section when the air flows along the side of the display unit, thereby reducing a dimension of the front-rear direction of the display device, and enabling a slim design of the display device.

The duct is provided at the side of the display unit and the air is moved from the open air flow pathway to a flow pathway provided by the duct so that the structures of the second pin and the heat pipe are not exposed to the outside thereof and the air that flows through the open air flow pathway may concentrically flow into the second pin and the heat pipe.

The air that flows through the open air flow pathway may flow by the flow fan provided in the duct at a position spaced apart from the second pin. For example, the flow fan may be installed at an inlet or an outlet of the duct, to facilitate the maintenance of the fan.

The open air flow pathway may be provided on at least one of left and right sides of the display unit. This structure enables the heat pipe to be provided at a position adequate for extending vertically in the condensation section of the circulating heat pipe and enables the thickness of the display device to not be increased.

The open air flow pathway may include a pathway where the air flows through the rear space of the display unit and the rear space of the closed air circulation pathway. That is, according to the present disclosure, in the structure of the cooler, the position where the condensation section of the heat pipe and the second pin are provided is not necessarily limited to the side of the display unit, but may be provided at various types of positions. Even through the condensation section is provided rearward of the display unit, the evaporation section and the condensation section of the heat pipe are not overlapped with each other in the thickness direction (forward and rearward directions) of the display device, so that the thickness of the display device is not increased or the increase in the thickness of the display device is minimized. When the heat pipe is used, the heat pipe may be arranged at a part of the closed air flow pathway, and the heat pipe may be arranged at a part of the open air flow circulation pathway so that the evaporation section of the heat pipe is not overlapped with the condensation section of the heat pipe. This arrangement is clearly different from the structure of the heat exchanger in the related art.

The first pin may have a planar shape that is perpendicular to the vertical axis, and may include the structure in which the plurality of first pins are spaced apart from one another and are arranged. In addition, the evaporation section of the circulating heat pipe may contact the first pin through the first pin. As the heat pipe in contact with the first pin includes a section extending vertically, when the structure of the first pin is configured in this manner, the first pin and the evaporation section of the heat pipe may be simply made.

The second pin may have a planar shape perpendicular to the lateral axis and may include a structure in which a plurality of second pins are spaced apart from one another laterally and are arranged, or the second pin may have a planar shape perpendicular to the forward and rearward axis of the display unit and may include a structure in which a plurality of second pins are spaced apart from one another in the forward and rearward direction thereof and are arranged. By means of this structure, when the open air flow pathway is provided at the left side or the right side of the display unit, the air that moves vertically may flow smoothly and the condensation section of the circulating heat pipe may extend vertically.

The second pin may have a planar shape perpendicular to the vertical axis and may include a structure in which the plurality of second pins are spaced apart from one another vertically and are arranged. In this structure, when the open air flow pathway is provided at the rear space of the display unit, the air that moves laterally flows smoothly, while the condensation section of the circulating heat pipe extends vertically.

Therefore, the condensing section of the circulating heat pipe may contact the second pin through the second pin while having vertically extending section.

The present disclosure also provides a display device including: a display that has a display surface; a housing that has the display unit and an external communicator in an open air flow pathway; a front plate that is arranged at a front space of the display surface and spaced apart from the display surface and defines a part of a closed air circulation pathway; a closed air circulation pathway where air circulates through a space between the display surface and the front plate, a side space of the display unit, and a rear space of the display unit; an open air flow pathway that is arranged adjacent to the closed air circulation pathway and communicates with an external communicator of the housing; and a heat exchanger including a heat pipe in which refrigerant is evaporated by absorbing heat from the closed air circulation pathway, and the refrigerant is condensed by discharging the heat into the open air circulation pathway, and a pathway where refrigerant is moved from the closed air circulation pathway to the open air flow pathway and a pathway where the refrigerant is moved from the open air flow pathway to the closed air circulation pathway are separately provided. That is, according to the present disclosure, the display device may have the structure of the heat pipe as a circulating structure.

The section where the refrigerant evaporates in the heat pipe includes a part extending vertically, so that the evaporated refrigerant may smoothly ascend by buoyancy.

The section where the refrigerant is condensed in the heat pipe includes a vertically extending portion, of the heat pipe, so that the condensed refrigerant may smoothly descend by the weight of the refrigerant.

At least a part of the section where the refrigerant evaporates in the heat pipe may contact the first pin provided in the closed air circulation pathway, thereby promoting the heat absorption and the evaporation of the refrigerant in the heat pipe.

At least a part of the section of the heat pipe where the refrigerant is condensed may contact the second pin provided in the open air flow pathway to promote the heat generation and the condensation of the refrigerant in the heat pipe.

The open air flow pathway includes a pathway where the air flows along the side of the display unit, thereby having a slim device.

The open air flow pathway includes a pathway where the air flows through the rear space of the display unit and the rear space of the closed air circulation pathway, so that the structure of the heat exchanger may be simply designed, and the slim device may be made.

Advantageous Effects

According to the present disclosure, a cooling structure of a display device may be compact and simplified and cooling efficiency of the display device may be significantly enhanced, and a thickness of the display device may be further reduced.

Further, according to the present disclosure, it is possible to more concentrically cool a portion in which a large amount of heat is generated, and thus a compact cooler may be designed.

Further, the present disclosure provides simple maintenance of the display device.

The specific effects of the present disclosure in addition to the above-mentioned effects will be explained in the detailed description to implement the present disclosure.

DESCRIPTION OF DRAWINGS

FIG. 22 is a plan view of a display device that has a structure of a heat exchanger according to a seventh embodiment of the present disclosure.

DESCRIPTION OF REFERENCE NUMERALS OF MAIN PART IN FIGURES

Figure 1:
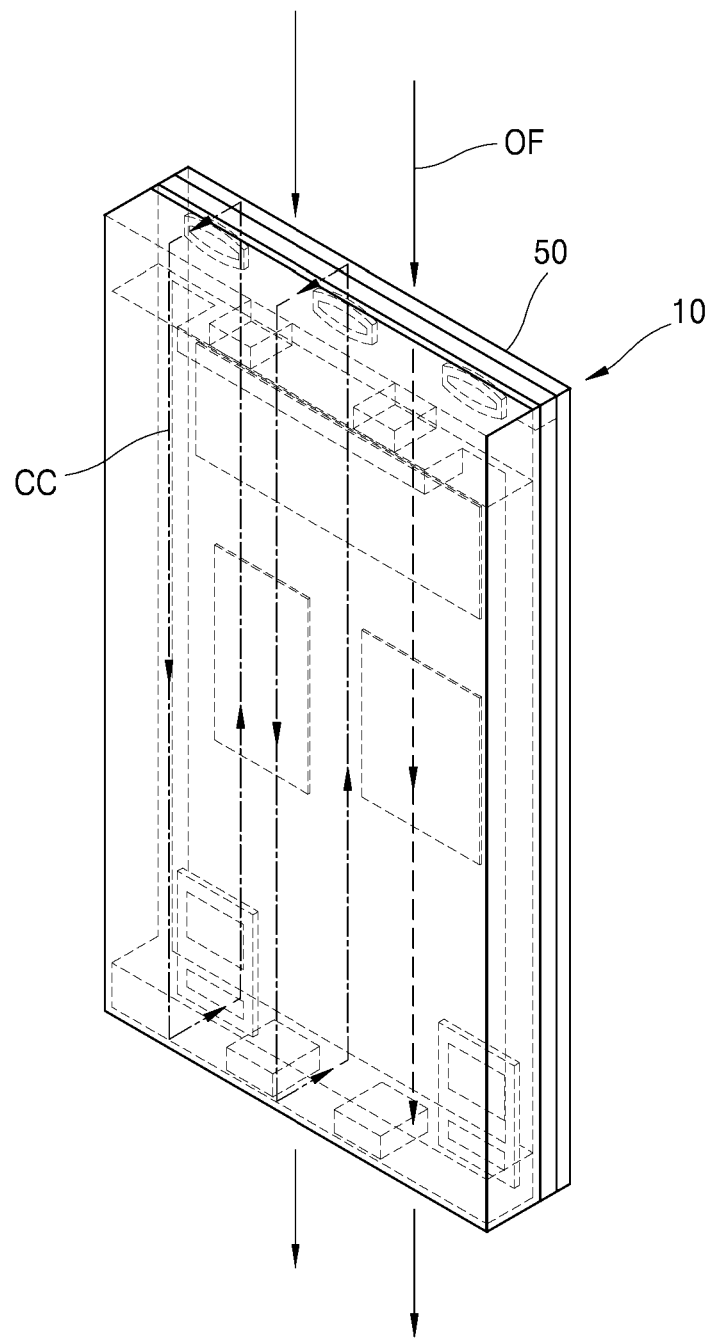
FIG. 1 is a perspective view of a display device that has a cooling structure according to a first embodiment of the present disclosure.

CC: Closed air circulation pathway
OF: Open air flow pathway
10: Display device
30: Display unit
31: Display surface
40: Circuit board
50: Housing
51: Front plate
53: Rear plate
55: First side plate (short sides of the upper and lower sides)
57: Second side plate (long sides of the left and right sides)
70: Duct
72: Second pin (or second fin) (OF)
74: Flow fan (OF)
81: First pin (or first fin) (CC)
83: Circulating fan (CC)
90: Heat pipe (circulating heat pipe)
91: Evaporation section
92: Gas-phase section
93: Condensation section
94: Liquid-phase section

BEST MODE

Hereinafter, preferred embodiments of the present disclosure will be described in detail with reference to the accompanying drawings.

The present disclosure may be implemented in many different manners and should not be construed as limited to the embodiments set forth herein. Rather, these embodiments are provided so that this disclosure will be thorough and complete, and will fully convey the scope of the disclosure to those skilled in the art.

First Embodiment

Figure 2:
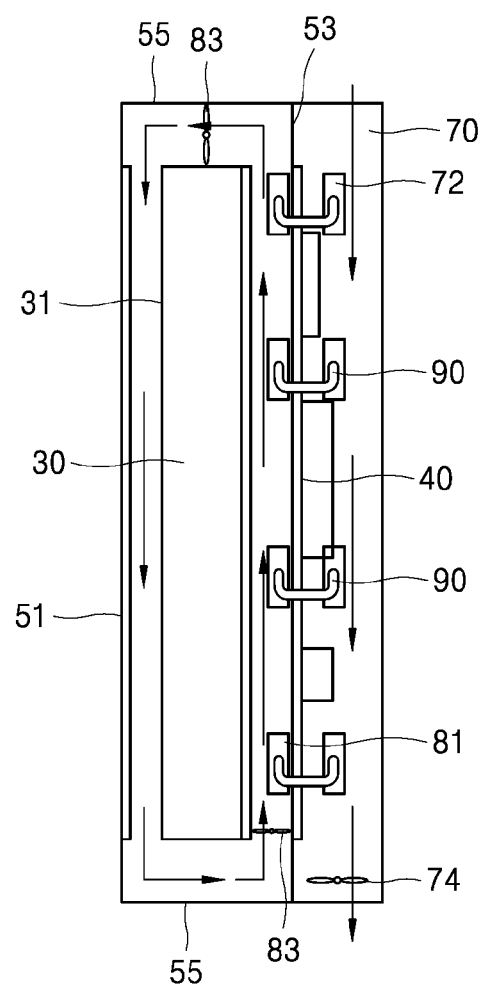
FIG. 2 is a side cross-sectional view of FIG. 1.
Figure 3:
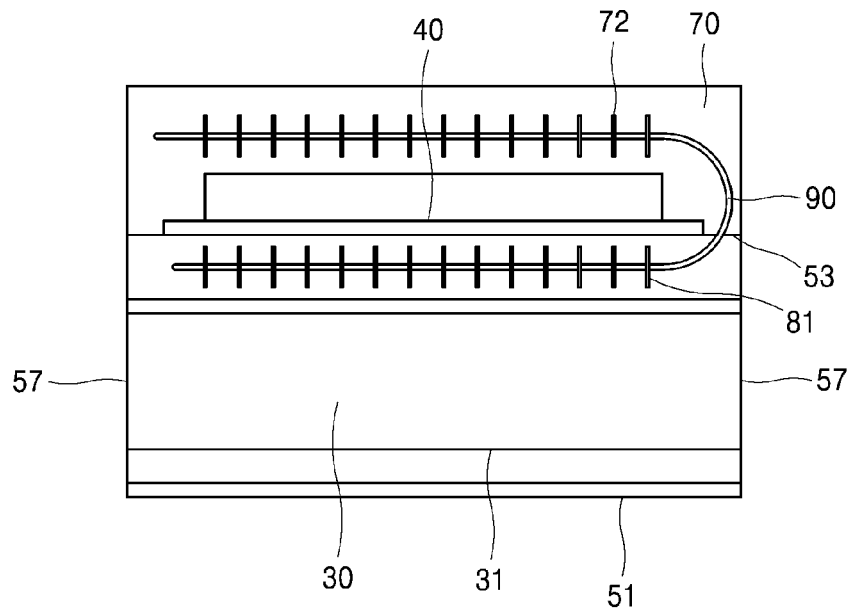
FIG. 3 is a plan cross-sectional view of FIG. 1.
Figure 4:
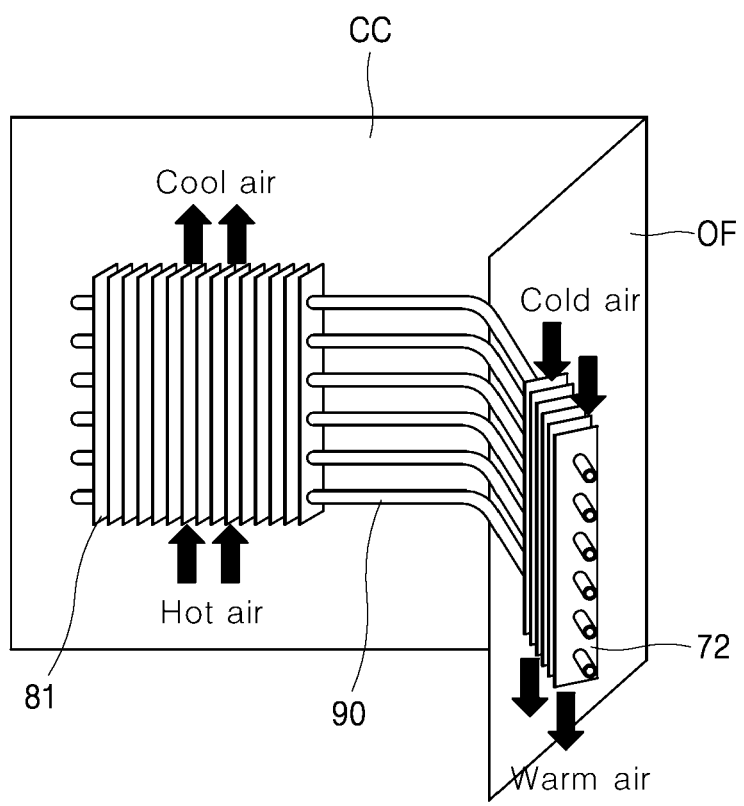
FIG. 4 is a schematic view of a cooling structure according to the first embodiment.

FIG. 1 is a perspective view of a display device that has a cooling structure according to a first embodiment of the present disclosure. FIG. 2 is a side cross-sectional view of FIG. 1, FIG. 3 is a plan cross-sectional view of FIG. 1, and FIG. 4 is a schematic view of a cooling structure according to a first embodiment.

A display unit 30 including a display such as an LCD or an OLED is modularized and accommodated in a housing 50. A front surface of the display unit 30 includes a display surface 31 on which a screen is outputted and the display surface 31 is spaced apart from the front plate 51 of the housing by a predetermined distance. There is a gap between the front plate 51 that is made of a transparent material to see through the display surface 31 from the outside thereof and the screen 31 of the display unit 30 so that this space defines a part of the closed air circulation pathway described below, through which the air may circulate.

A circuit board 40 on which related components such as a power supply circuit, a screen control circuit, and the like are mounted is installed rearward of the display unit 30. Further, the circuit board 40 may be installed in a separate space from the display unit 30. In the embodiment of the present disclosure, the circuit board 40 is fixed to a rear plate 53 of a housing 50. For example, the rear plate 53 (see FIG. 2) in which the parts related to the board are installed is arranged rearward of the display unit 30 and the predetermined space is provided between the rear surface of the display unit 30 and the rear plate 53 of the housing. This space defines a part of the closed air circulation pathway described below, through which the air may circulate. Of course, the position in which the circuit board 40 is installed is not necessarily limited to the rear plate 53 of the housing, and for example, the circuit board 40 may be installed on the rear surface of the display unit 30 directly or through a bracket.

A first side plate 55 of the housing is provided at a short side of four edges of the display device and is connected to the front plate and the rear plate of the housing to cover the upper and lower sides of the display device as shown in the figures. A second side plate 57 of the housing is provided at a long side of four edges of the display device and is connected to the front plate and the rear plate of the housing to cover the left and right sides of the display device.

As described above, the housing 50 of the display device 10 has the display 30 and associated parts with the display device 30, which are internal components, and isolates the display unit 30 and the associated parts with the display device 30 from the outside air.

A closed air circulation pathway (CC) is provided in the space that is isolated from the outside by the housing 50. The CC includes a pathway where air circulates through the space provided in front of the display unit 30, a space provided at the side of the display unit, and a space provided at the rear of the display, in the housing. The air circulating through this pathway is isolated such that the air circulating this pathway is not mixed with the outside air. In the first embodiment, the air circulation pathway includes a pathway where the air circulates through the front space of the display unit, the space provided at the side of the short edge of the display unit, that is, provided on the upper portion and the lower portion of the display unit as shown in the figures, and the rear space of the display unit. That is, the CC covers the display unit along a long side of the display unit and circulates in a closed loop form thereof.

As shown in figures, the circulation fan 83 that circulates air is installed adjacent to a side or a rear surface of the display unit 30 to enable the air flow. For example, the circulation fan 83 is provided at one end of the rear surface of the display 30 to suction the air at a short side of the display unit 30 and discharge the air into the short other side of the display unit 30.

The circulation fan may be arranged at various types of positions other than the above mentioned positions. For example, the circulation fan 83 may be installed adjacent to the side of the display unit to suction the air in the rear space of the display unit 30 and discharge the air into the front space of the display unit 30, and the air may flow in an opposite direction thereof.

In addition, the circulating fan may be installed at various kinds of positions, for example, forward or rearward of the first pin of the heat exchanger described below and may circulate the air along the CC.

In the first embodiment of the present disclosure, the air circulates through the front space of the display unit, the space facing one short side of the display unit, the rear space of the display unit, and the space facing the other short side of the other short side of the display. In the second embodiment or the third embodiment described below, it is possible to use a structure in which the air circulates through the front space of the display unit, the space facing one long side of the display unit, the rear space of the display unit, and the space facing the other side of the display unit.

Further, a structure in which the air circulates through the front space of the display unit, the space facing the one long side of the display unit and the space facing the other short side of the display unit, the rear space of the display unit, and the rear space facing the one long side of the display unit and the rear space facing the other short side of the display unit.

Particularly, the structure in which the air circulates through the space facing both the long side and the short side of the display unit is difficult to be applied to a structure in which an air-to-air heat exchanger with the partition therebetween in the related art or is not suitable for the structure in which the air-to-air heat exchanger is installed. However, according to the present disclosure, the heat exchange is made adjacent to the side of the display in a structure in which the heat exchanger including the structures of the heat pipe and the pin described below are arranged at the side of the display unit, and there is no problem in that the air circulates along the long side and the short side of the display unit.

A duct 70 that defines an open air flow pathway is provided on the rear surface of the rear plate 53 of the housing 50 as the rear of the display unit 30. The open air flow pathway of the duct is provided along a longitudinal direction of the duct. The air flowing through the duct is pressurized by and flows by the flow fan 74 installed in the duct. The flow fan 74 is spaced apart from the heat pipe 90 and a second pin 72 in contact with the heat pipe 90 as the heat exchanger, which will be described below. The flow fan 74 is disposed near the heat pipe 90 or the second pin 72, so that the air is concentrically discharged to the heat pipe 90 and the second pin 72, thereby further enhancing the heat exchange efficiency of the heat exchanger.

In the first embodiment of the present disclosure, the heat exchanger of the structure that has the cooler includes the first pin 81 arranged in a CC, the second pin 72 arranged in an open air flow pathway (OF), and the heat pipe 90 that connects the first pin 81 and the second pin 72 and accommodates a refrigerant.

A heat pipe rapidly transfers heat from one side of the heat pipe to the other side of the heat pipe by evaporating fluid in the heat pipe. This heat pipe is made by evacuating the inside of the heat pipe and decompressing and is filled with volatile liquid (for example, refrigerant) in an inner space where a lot of small holes are provided. When the heat is applied to one end of this pipe, the volatile liquid evaporates and moves to the other end of this pipe with thermal energy. The evaporated gas dissipates the heat and is liquefied at the other end of the pipe, and the liquid returns back to the original position of the liquid by a capillary phenomenon. A heat transfer rate of the heat pipe is faster than copper or aluminum with high thermal conductivity by 50 times. Copper, stainless steel, ceramics, tungsten, and the like are used as the examples of the materials of a main body of the heat pipe, and porous fiber is used as an example of a material of an inner wall of the heat pipe. Methanol, acetone, water, mercury, and the like are used as volatile substances in the heat pipe.

According to the present disclosure, it is repeated that the refrigerant in the heat pipe is evaporated by absorbing the heat of the air circulating through the first pin provided in the CC and the evaporated refrigerant is condensed as the evaporated refrigerant discharges the heat to the air flowing adjacent to the second pin provided in the OF, and the condensed refrigerant is moved back to the first pin provided in the CC. The heat of the air in the CC is discharged into the OF.

That is, the section where the refrigerant evaporates in the heat pipe is disposed in the CC. In order to enhance the efficiency of heat transfer between the air circulating through the CC and the heat pipe, the first pin 81 may contact the heat pin disposed in the CC. That is, at least a section of the heat pin, in the evaporation section passes through the first pin and contacts the first pin. The first pin may have a form of a flat panel and may have a structure in which a plurality of first pins are separated from one another and are arranged.

The evaporated gaseous refrigerant passes through a compartment wall that separates the CC and the OF and moves by the capillary phenomenon, and the like through the section of the heat pipe extending from the CC to the OF.

The section where the refrigerant is liquefied, that is, condensed in the heat pipe is disposed in the OF. In order to enhance the heat transfer efficiency between the air flowing through the OF and the heat pipe, the second pin 72 may contact the heat pin disposed in the OF. That is, at least a section, of the heat pin, in the condensing section passes through the second pin and contacts the second pin. The second pin may have a form of the flat panel and may have a structure in which a plurality of second pins are separated from one another and are arranged.

Referring to FIGS. 2 and 3, the arranged first pins 81 have a form of a plane which is parallel to an air flow direction of the CC, so that the first pin enables minimizing interference with the air flow through the CC and maximizing a contact area with the air that circulates through the CC. Thus, the heat exchanger has the enhanced heat exchange efficiency.

The CC is provided in a space that is defined by a front plate 51, a rear plate 53 spaced apart from the front plate, a first side plate 55 that connects upper and lower short sides of the front plate and the rear plate, and a second side plate 57 that connects the left and right long sides of the front plate and the rear plate. Specifically, the air flows by the circulation fan 83 provided on the CC, and the air circulates through the space between the front plate 51 and the display surface 31, the space between the side of the display unit 30 and the side plate 55, a space between the rear surface of the display unit 30 and the rear plate 53 of the housing. The air circulating through the space absorbs the heat generated from the display unit or electrical components thereof and circulates through the path.

The first pin 81 that has a thin and elongated rectangular shape is arranged in the space between the rear surface of the display unit and the rear plate 53 of the housing in the CC. The first pin 81 has a form of a flat panel that is perpendicular to a lateral axis and has a structure in which a plurality of first pins are spaced apart from one another along the laterally direction of the axis and are arranged \. A number and an interval of the first pins may be changed within a range in which the heat exchange of the circulating air with the first pin is smoothly made without excessively interfering with the air circulation.

The heat pipe 90 extending laterally passes through the first pin 81. That is, the heat pipe that passes through the first pin contact the first pin at a portion where the heat pipe passes through the first pin. Thus, the heat of the first pin is transferred to the heat pipe very quickly. The laterally extending part of the heat pipe, which passes through the first pin, is in a section where the refrigerant is smoothly evaporated in the heat pipe. In the first embodiment, the first pins through which the heat pipe passes is arranged in a row in parallel with one another by a predetermined distance along a center of a vertically extending line of the first pin. Such the positions at which the heat pipe passes through the first pin and an arrangement of the first pins may be appropriately selected in consideration of heat exchange efficiency and a space required for the heat exchange, smooth flow of the refrigerant in the heat pipe, and the like.

The OF is provided rearward of the display unit 30 and rearward of the closed air circulation pathway CC, through which the air flows. That is, the duct 70 that defines the OF is arranged rearward of the rear plate 53 of the housing 50. The heat pipe is arranged across the CC and the OF through the rear plate 53 of the housing and a wall of the duct, and the portion through which the heat pipe passes is sealed to prevent the air in the CC from being mixed with the air in the OF and the air in the CC and the air in the OF do not leak.

A thin and elongated rectangular second pin 72 is arranged in the OF in the duct. The second pin 72 has the form of the flat panel perpendicular to a lateral axis, and has a structure in which a plurality of second pins are spaced apart from one another along the lateral axis and are arranged. This structure is schematically shown in FIGS. 2 to 4; however, it is intended to provide understanding of this structure. A number and an interval of the second pins may be changed within the range in which the heat exchange of the flowing air with the second pin is smoothly made without excessively interfering with the air circulation.

The plurality of heat pipes 90 are arranged in a row in parallel with one another across the two paths CC and OF and are integrally fixed to the plurality of first pins through the plurality of first pins that are spaced apart from one another in the CC and are arranged and are integrally fixed to the plurality of second pins through the plurality of second pins that are spaced apart from one another and are stacked in the OF. Thus, the plurality of heat pipes 90 may be modularized as one component together with the first pin and the second pin.

Meanwhile, the circuit board 40 may be installed on the rear surface of the rear plate 53 of the housing 50 to be arranged in the OF. That is, the air circulating through the CC may be used to intensively cool the heat generated from the display unit 30, and the circuit board 40 may be cooled in the OF to which the new and fresh air is supplied continuously. As the new air is continuously supplied to the OF, even though the circuit board 40 is provided in this path, the heat of the heat pipe may be discharged into the second pin 72.

In the first embodiment, according to an arrangement of the CC and the OF, an overall area of the display device 10 may be reduced.

Further, the thickness of the display device may not be significantly increased. That is, it is also possible to minimize an increase in thickness of the display device by, for example, arranging the second pin 72 at a portion other than the portion occupied by the circuit board 40 in the OF.

Second Embodiment

Figure 5:
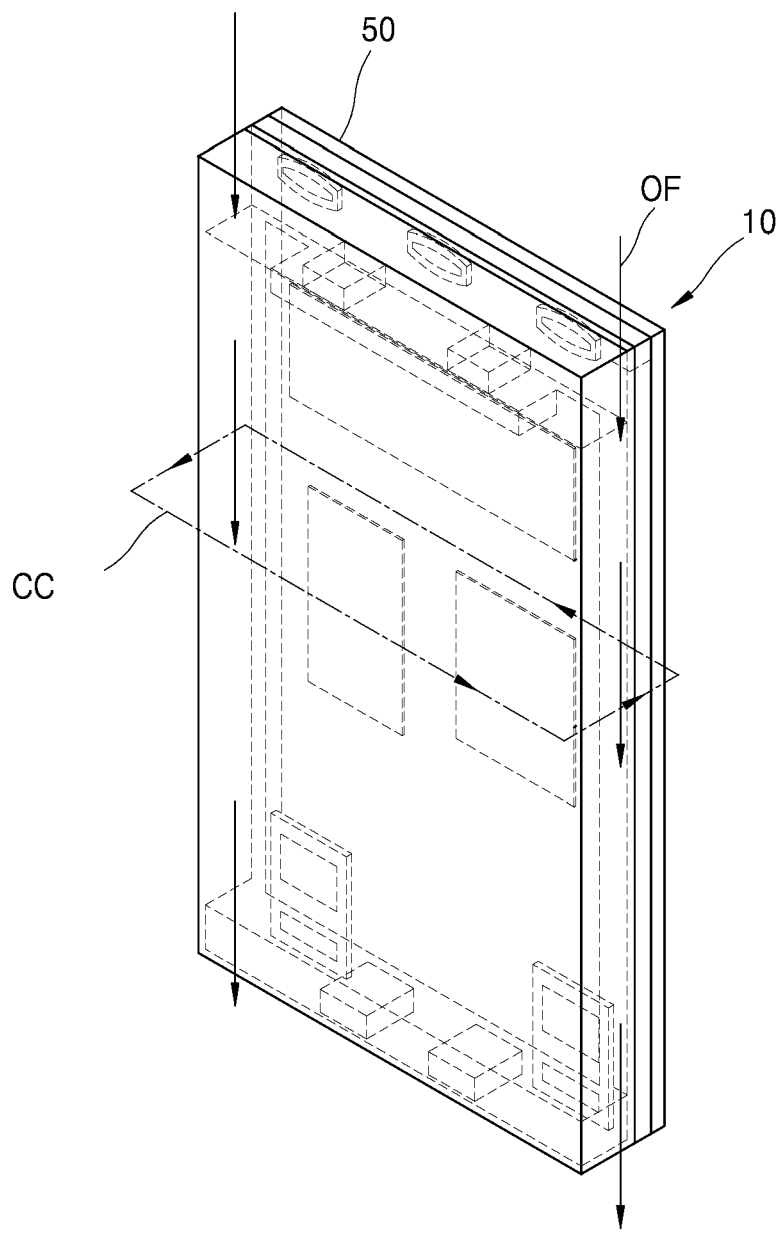
FIG. 5 is a perspective view of a display device that has a cooling structure according to a second embodiment of the present disclosure.
Figure 6:
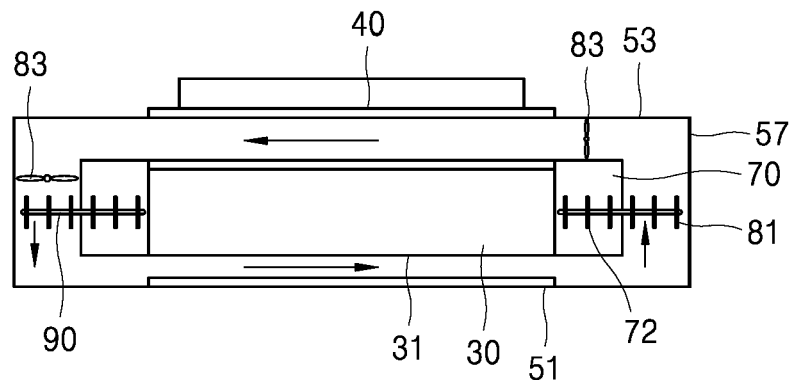
FIG. 6 is a plan cross-sectional view of FIG. 5.
Figure 7:
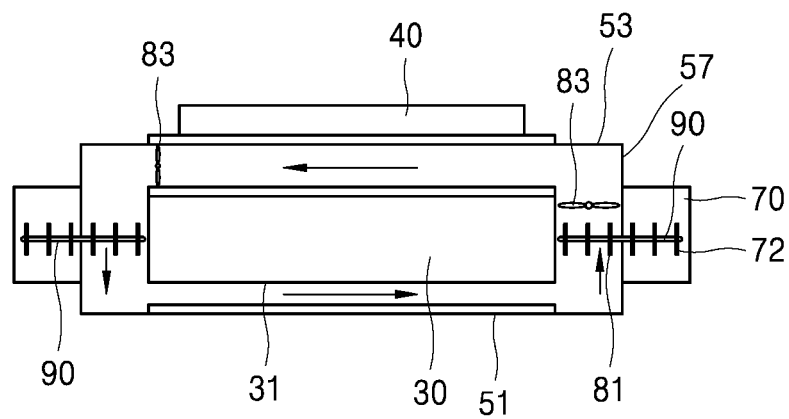
FIG. 7 is a plan cross-sectional view of a modification of FIG. 6.
Figure 8:
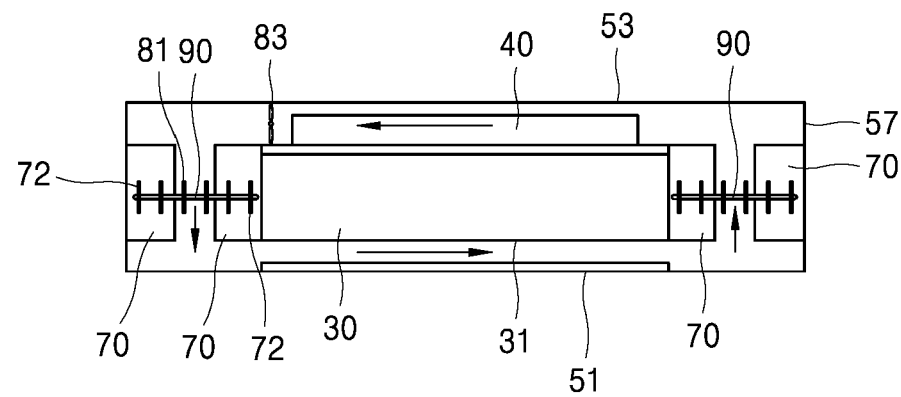
FIG. 8 is a plan cross-sectional view of another modification of FIG. 6.
Figure 9:
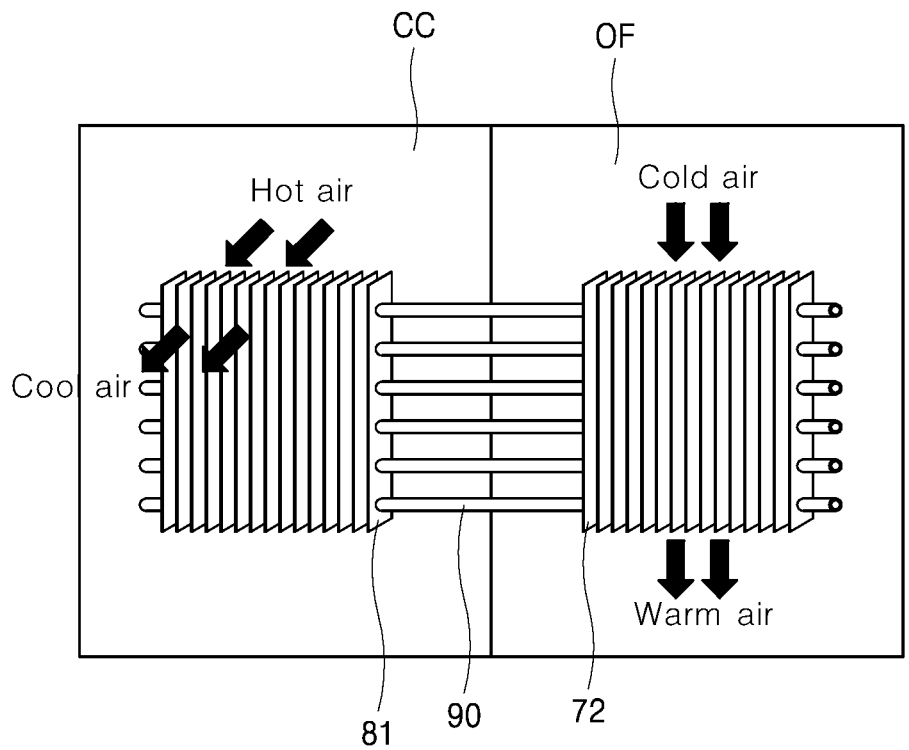
FIG. 9 is a schematic view of a cooling structure according to a second embodiment.

FIG. 5 is a perspective view of a display device that has a cooling structure according to a second embodiment of the present disclosure. FIG. 6 is a plan cross-sectional view of FIG. 5. FIG. 7 is a plan cross-sectional view of a modification of FIG. 6. FIG. 8 is a plan cross-sectional view of yet another modification of FIG. 6. FIG. 9 is a schematic view of a cooling structure according to a second embodiment.

Hereinafter, only a part different from the part in the first embodiment will be mainly described, and a repetitive description will be omitted with respect to the part that is not different from the part in the first embodiment. In other words, it may refer to the contents in the other embodiments with respect to the part that is not described in the illustration of the second embodiment.

In the second embodiment, the air circulates through the air circulation pathway including a front space of the display unit, a space facing one long side of the display unit, that is, provided at the left side and the right side of the display unit in the figures, and a rear space of the display unit. That is, the air circulates, through a closed air circulation pathway, in a closed loop manner along a short circumference of the display unit, while covering the display unit.

A circulation fan 83 that circulates the air is provided at one end of the rear surface of a display unit 30 to suction air in the side space of the longer side of the display unit 30 and discharge the air into a space of the other long side of the display unit 30. In addition, the circulation fan 83 may be installed at the side of the display unit to suction the air in a rear space of the display unit 30 to discharge the air into a front space of the display unit 30 and may enable the air to flow in an opposite direction to the above mentioned direction.

In the second embodiment of the present disclosure, the air circulates through the front space of the display unit, a space facing one long side of the display unit, the rear space of the display unit, and the space facing the other long side of the display unit. However, as described in the first embodiment, the structure in which the air circulates through the front space of the display unit, the space facing one short side of the display unit, the rear space of the display unit, and the space facing the short other side of the display unit are circulated may be applied to the present disclosure.

An open air flow pathway is provided along a second side plate 57 of at least one side of the left and right sides of the display device. In the second embodiment, the open air flow pathway is provided at both left and right sides of the display device.

The open air flow pathway is defined by the duct 70 provided along a longitudinal direction of a side of the display device. The air flowing through the duct 70 is pressurized and flows by a flow fan (not shown) provided near an end of the duct.

Referring to FIG. 6, the duct 70 is provided in contact with the side of the display unit 30. Thus, the side of the display unit may be directly cooled by the air that is received from the outside of the display device and flows through the duct. Further, the duct 70 is surrounded by the closed air circulation pathway and arranged inside of the closed air circulation pathway to provide an area where the open air flow pathway contacts the closed air circulation pathway.

As another modification, referring to FIG. 7, the duct 70 may be provided near the side of the display unit 30 and outside of the closed air circulation pathway, that is, outside of the second side plate 57 of the housing. Thus, the closed air circulation pathway completely covers the display unit, simplifying the structure of the display device and generally cooling the display unit.

As yet another modification, referring to FIG. 8, two or more ducts 70 are provided and the two or more ducts 70 are spaced apart from one another and air flows through each area between the two ducts, which are separately arranged, in the closed air circulation pathway. According to this structure, the contact area between the closed air circulation pathway and the open air flow pathway may be further provided due to the shape of this duct.

According to the second embodiment of the present disclosure, the heat exchanger that has the structure of the cooler includes a first pin 81 arranged in a closed air circulation pathway CC and a second pin 72 arranged in an open air flow pathway OF and a heat pipe 90 that connects the first pin 81 and the second pin 72 and accommodate a refrigerant. The first pin is disposed in the CC at the side space of the display unit 30. Further, the second pin is disposed in the duct 70. The heat pipe connects the first pin and the second pin and is arranged to pass through the CC and the OF.

The first pin and the second pin have the form of a flat panel and the plurality of first pins and second pins are spaced apart from one another and are arranged, respectively, and are arranged at the side space of the display unit, and the heat pipe is also arranged at the side space of the display unit. Further, when the flow fan or the circulation fan is arranged at the side space of the display unit, a less thickness of a housing 50 that covers the display unit 30 may be made, which enables a slim design of the display device.

Referring to FIGS. 6 and 7, the arranged first pin 81 and second pin 72 have the form of the flat plane which is parallel to an air flow direction of the CC and the OF, respectively. Therefore, the first pin 81 and the second pin 72 maximize the contact area with the air while minimizing interference with the air flow, thereby having enhanced high heat exchange efficiency thereof.

The air flows, through the CC, by a circulation fan 83 provided on the CC and flows through the space between the front plate 51 and the display surface 31, a space between the side of the display unit 30 and the side plate 57, a space between the rear side of the display unit 30 and the rear plate 53 of the housing. The air circulating through the space absorbs the heat generated from the display or electronics thereof and circulates through the path.

A thin and elongated rectangular first pin 81 is arranged in the space between the side of the display unit and the side plate 57 of the housing in the CC. The first pin 81 has a shape of a flat panel perpendicular to a lateral axis, and has a structure in which the plurality of first pins 81 are spaced apart from one another along the lateral direction of the first pin and are arranged. The number and the interval of the first pins may be changed within a range in which the heat exchange between the circulating air and the first pin may be smooth without excessively interfering with the air circulation.

The heat pipe 90 extends laterally and passes through the first pin 81. That is, the heat pipes that pass through the first pins contact the first pins at a portion through which the heat pipe passes. Thus, a heat of the first pin is transferred to the heat pipe very quickly. The laterally extending part of the heat pipe that passes through the first pin is in a section where refrigerant is smoothly evaporated in the heat pipe. In the first embodiment, the positions in which the heat pipe passes through the first pin are provided in a row in parallel with one another at predetermined intervals along a longitudinally extending line of the first pin. Such the positions in which the heat pipe passes through the first pin or arrangements of the first pin may be appropriately selected in consideration of heat exchange efficiency and space require for exchanging the heat between the heat pipe and the first pin, smooth flow of refrigerant in the heat pipe, and the like.

The OF is provided at the side space of the display unit 30, and the air flows vertically in the OF. The heat pipe is arranged across the CC and the OF through a wall of the duct and the portion through which the heat pipe passes is sealed so that air in the CF is not mixed with the air in the OF and the air in the CF and the air in the OF do not leak. In the second embodiment, the heat pipe may have a short linear shape.

A thin and elongated rectangular second pin 72 is arranged in the OF in the duct. The second pins 72 has the form of the flat panel perpendicular to a lateral axis, and the plurality of second pins 72 are spaced apart from one another along the lateral axis and are arranged.

The plurality of heat pipes 90 are arranged in a row in parallel with one another across the two paths CC and OF. The heat pipe is integrally fixed to the plurality of first pines through the plurality of first pins that are spaced apart from one another and are arranged in the CC. The heat pipe is integrally fixed to the plurality of second pins through the plurality of second pins that are spaced apart from one another and are arranged in the OF. Thus, the plurality of heat pipes 90 may be modularized as one component together with the first pin and the second pin.

Meanwhile, as shown in FIGS. 6 and 7, the circuit board 40 may be installed on the rear surface of the rear plate 53 of the housing 50 to be arranged outside of the CC. That is, the air circulating through the CC may be used to concentrically cool the heat generated from the display unit 30. If necessary, as shown in FIG. 8, the circuit board may be arranged in the CC, that is, between the rear surface of the display unit 30 and the rear plate 53 of the housing to enable the display device 10 to have a slim shape.

According to the arrangement of the CC and the OF of the second embodiment, it is very advantageous in that the display device 10 has the slim shape, and the length of the heat pipe may be minimized to reduce a producing cost of the heat exchanger.

Third Embodiment

Figure 10:
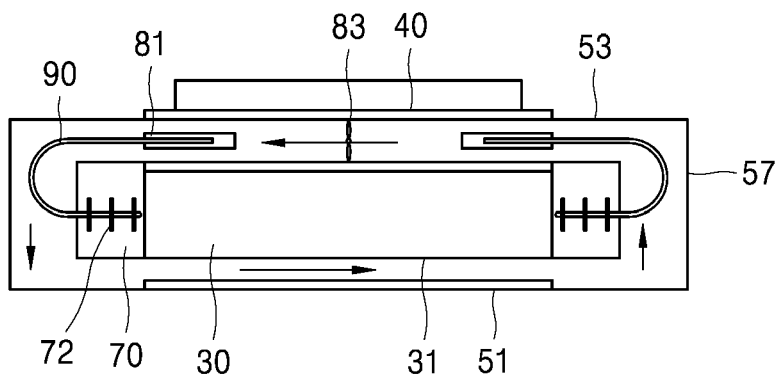
FIG. 10 is a plan cross-sectional view of a display device that has a cooling structure according to a third embodiment of the present disclosure.
Figure 11:
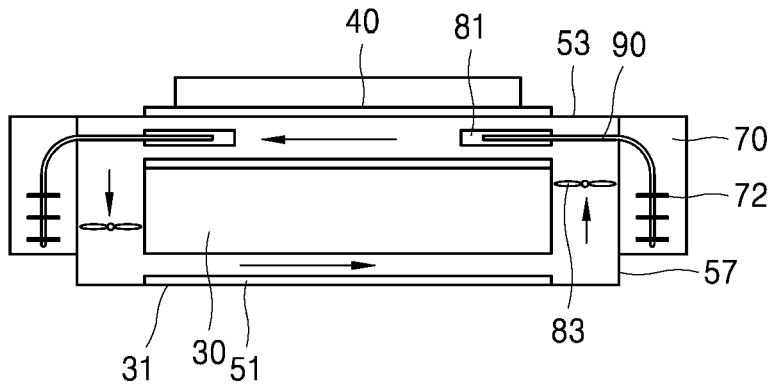
FIG. 11 is a plan cross-sectional view of a modification of FIG. 10.
Figure 12:
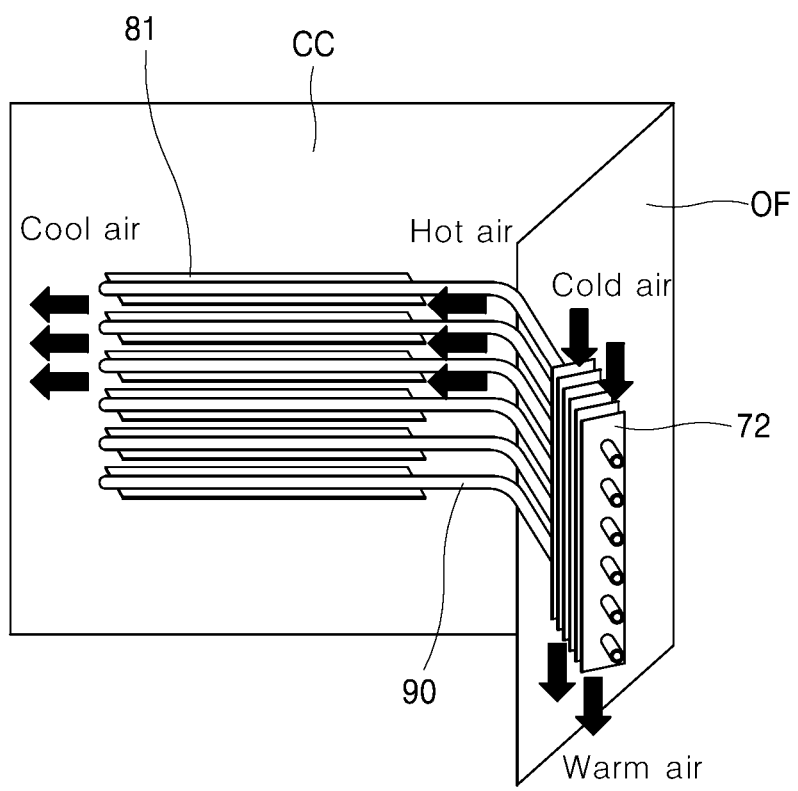
FIG. 12 is a schematic view of a cooling structure according to a third embodiment.

FIG. 10 is a plan cross-sectional view of a display device that has a cooling structure according to a third embodiment of the present disclosure, FIG. 11 is a plan cross-sectional view of a modification of FIG. 10, and FIG. 12 is a schematic view of a cooling structure of a third embodiment.

In the third embodiment, as a closed air circulation pathway (CC) and an open air flow pathway (OF) may be the same as the second embodiment, this configuration may be understood with reference to FIG. 5 and the description of the second embodiment related to FIG. 5.

Referring to FIGS. 10 and 11, the OF is provided along a second side plate 57 at both left and right sides of the display device. The OF is defined by a duct 70 provided in parallel with the side of the display device along a longitudinal direction of a side of the display device. The air flowing through the duct 70 is pressurized and flows by a flow fan (not shown) provided near an end of the duct.

Referring to FIG. 10, the duct 70 is provided in contact with a side of the display unit 30. According to another modification, referring to FIG. 11, the duct 70 may be provided at the side of the display unit 30 and outside of the OF, that is, outside of the second side plate 57 of the housing.

According to the third embodiment of the present disclosure, the heat exchanger that has a structure of a cooler includes a first pin 81 arranged in a closed air circulation pathway CC, a second pin 72 arranged in an open air flow pathway OF, and a heat pipe 90 that connects the first pin 81 and the second pin 72 and accommodates a refrigerant. The first pin is disposed in the CC disposed rearward of the display unit 30. Further, the second pin is disposed in the duct 70. The heat pipe has a bent shape, and connects the first pin and the second pin, and is arranged to pass through the CC and the OF.

In comparison to the second embodiment, in the third embodiment, the first pin 81 is arranged rearward of the display unit 30, and the pins contact the heat pipe and are connected to the heat pipe along the longitudinal direction of the heat pipe 90. The plurality of heat pipes 90 are fixed to a plurality of second pins 72, which are spaced apart from one another and are arranged in the OF so that the plurality of heat pipes 90 and the plurality of second pins 72 are integrally modularized and considered as a single part. In consideration of the above, the first pins 81 in the CC contact the longitudinal direction of the heat pipe 90 in parallel with the heat pipe so that the contact area, of the first pin, with the heat pipe may further extend. The first pins 81 are also parallel to the air flow direction of the CC shown in FIG. 5, which does not interfere with the air circulation.

On the other hand, the heat pipe 90 and the pin 81 of the heat exchanger may be arranged over the space of the CC and may be provided at a portion different from another portion at which other components of the display device are provided in consideration of a volume of other components of the display device. Further, the heat pipe 90 and the pin 81 may be arranged close to inner components in which a large amount of heat is generated, so that the heat in the specific space is concentrically absorbed.

Hereinafter, according to the present disclosure, cooling of the display device that has the heat exchanger will be described.

When the display device is operated, the heat is generated from the display unit and a chip of a PCB installed rearward of the display unit. The circulating fan 83 and the flow fan 74 cause the air circulation and the air flow through the CC and the OF, respectively.

Air absorbs the heat generated from the display unit and the accessories and circulates through the CC, and contacts the first pin disposed rearward of the display unit to transfer the heat to the first pin. The heat of the first pin 81 is then transferred to the heat pipe 90, and the heat transferred to the heat pipe causes the refrigerant inside the heat pipe to evaporate and move toward the OF. That is, the heat absorbed into the first pin, in the CC, is quickly transferred to the second pin in the OF through the conduction of the heat pipe itself and the vaporized refrigerant in the heat pipe.

As a temperature of the air flowing through the OF is lower than the temperature of the section of the heat pipe and the second pin 72 disposed in the OF, gas-phase refrigerant in the heat pipe transfers the heat to the air in the OF through the second pin and the refrigerant is condensed and generates heat of condensation to transfer a large amount of heat to the air in the OF.

Meanwhile, the condensed refrigerant quickly moves back to the CC by a capillary phenomenon, and the like.

Accordingly, according to the present disclosure, the display device that has the structure of the heat exchanger may be cooled very efficiently. The heat exchanger occupies less volume, and has the enhanced heat exchange efficiency, thereby designing a compact and slim display device.

[Cooling Structure of Display Device According to Another Embodiment]

Figure 13:
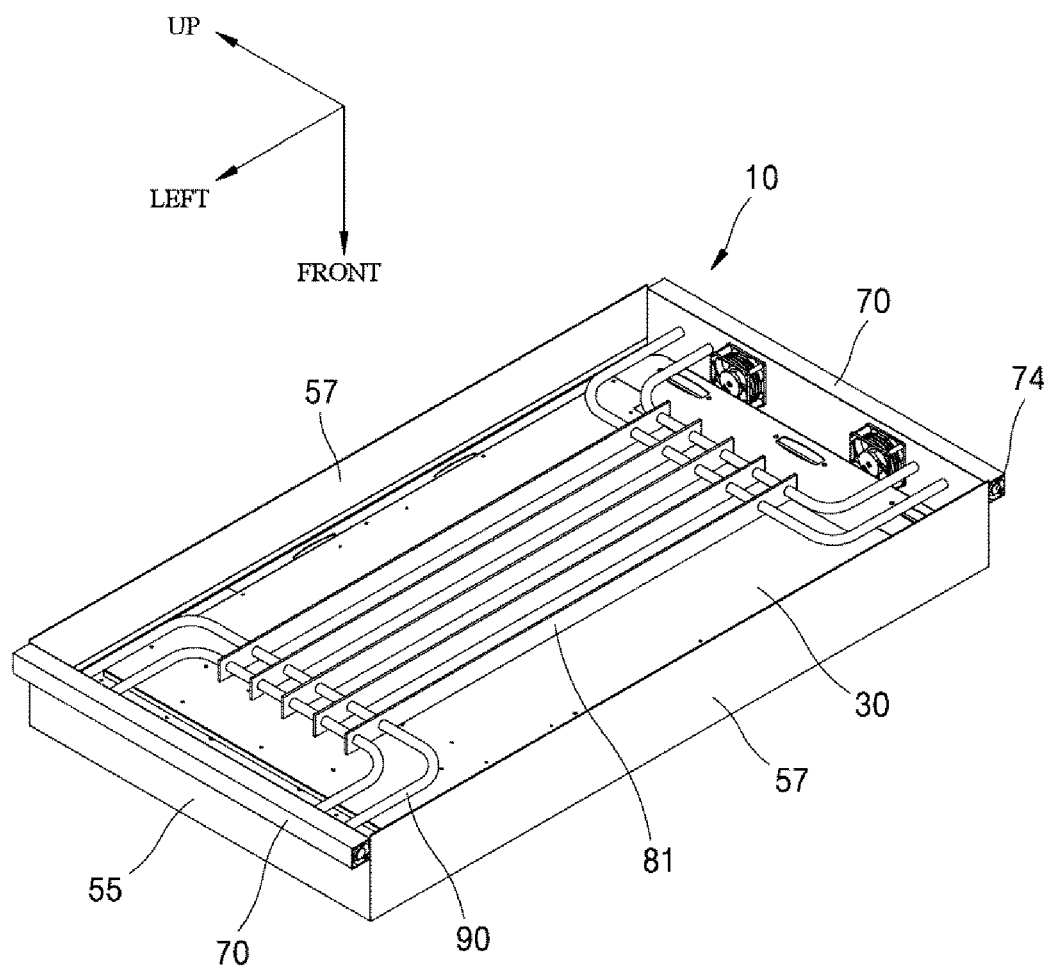
FIG. 13 is a rear perspective view of a display device that has a cooling structure when a rear plate of a housing is omitted according to another embodiment of the present disclosure.

FIG. 13 is a rear perspective view of a display device that has a cooling structure when a rear plate of a housing is omitted from FIG. 13 according to another embodiment of the present disclosure. Hereinafter, the matters overlapping with those in the first to third embodiments will be omitted.

A substrate including a power supply circuit, a screen control circuit, and related components are installed on a rear surface of a display unit 30, which may be installed on the rear surface of the display unit 30 directly or through a bracket.

A first side plate 55 of the housing is provided at a short side of four edges of the display device and is connected to the front plate and the rear plate of the display device to cover the left and right sides of the display device. A second side plate 57 of the housing is provided at a long side of four edges of the display device and is connected to the front plate and the rear plate of the display device to cover the upper and lower sides of the display device.

A duct 70, which defines the OF, is provided on a short side of four edges as a side of the display unit 30. The open air flow pathway of the duct is provided along the longitudinal direction of the duct.

A circulation fan 83 that circulates the air is installed in adjacent to the rear of the display unit 30 to allow the air to flow. For example, the circulation fan 83 is provided at one end of the rear surface of the display unit 30 to suction the air at the short side of the display unit 30 and discharge the air to the short other side of the display unit 30. The circulating fan may also be provided in various types of positions. For example, the circulation fan that circulates the air along the closed air circulation pathway may be installed at various types of positions such as the side of the display unit, the front or rear of the first pin of the heat exchanger described below.

According to the present disclosure, the air circulates through the front space of the display, the space facing one short edge of the display, the rear space of the display, and the rear space facing the short other side of the display, while it is possible to use a structure in which the air circulates through the front space of the display unit, a space facing a long side of the display unit, a rear space of the display unit, and a space facing other long side of the display unit.

In addition, a structure in which the air circulates through the front space of the display unit, the space facing the long side and the short side of the display unit, the rear space of the display unit, and the space facing the long other side and the short side of the display unit is applicable thereto. Particularly, a structure in which an air-to-air heat exchanger is installed with a partition therebetween may be difficult to or may be not adequate for being applied to a structure in which the air circulates through the long side and the short side of the display unit in the related art. However, the heat exchange is made between the heat pipe and the pin adjacent to the side of the display in a structure in which the heat exchanger that has the structures of the heat pipe and the pin is arranged at the side of the display unit to circulate the air along the long side and the short side of the display unit.

[Structure of Heat Exchanger]

Figure 16:
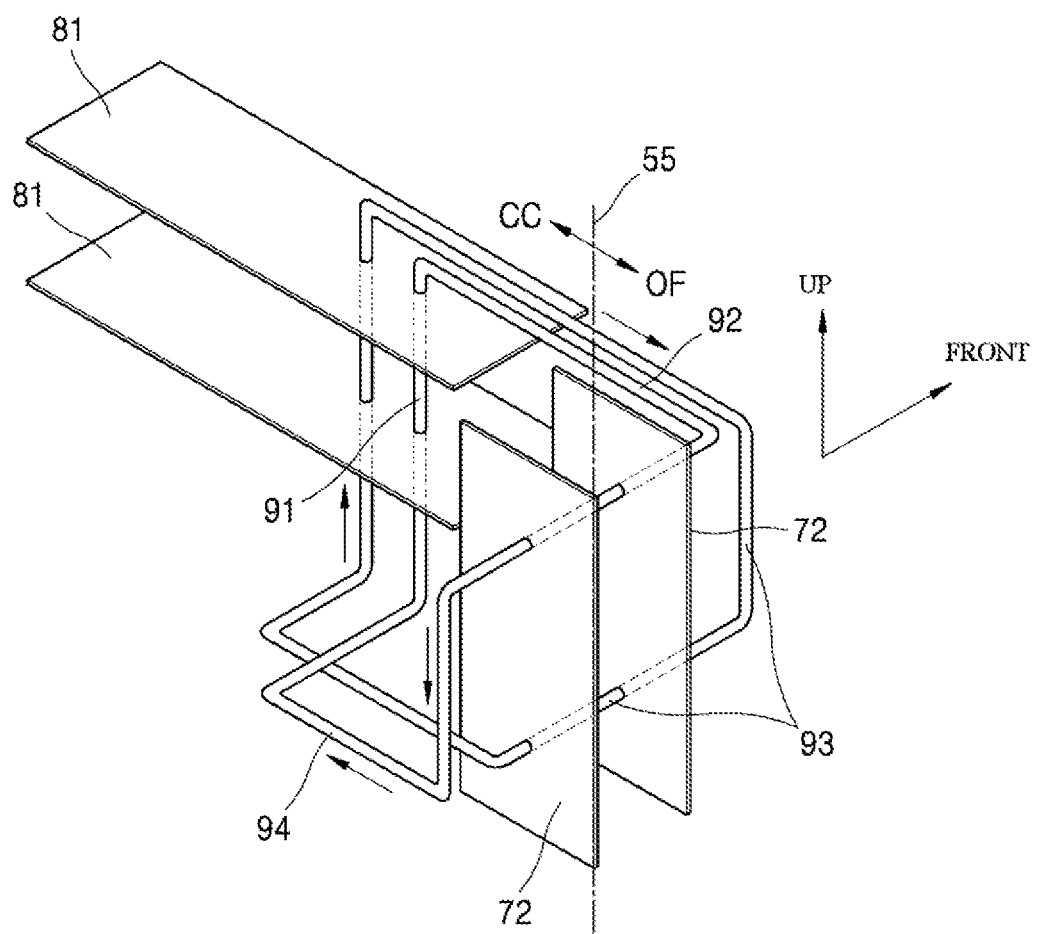
FIG. 16 is a perspective view of only a structure of a heat exchanger according to a fourth embodiment.
Figure 19:
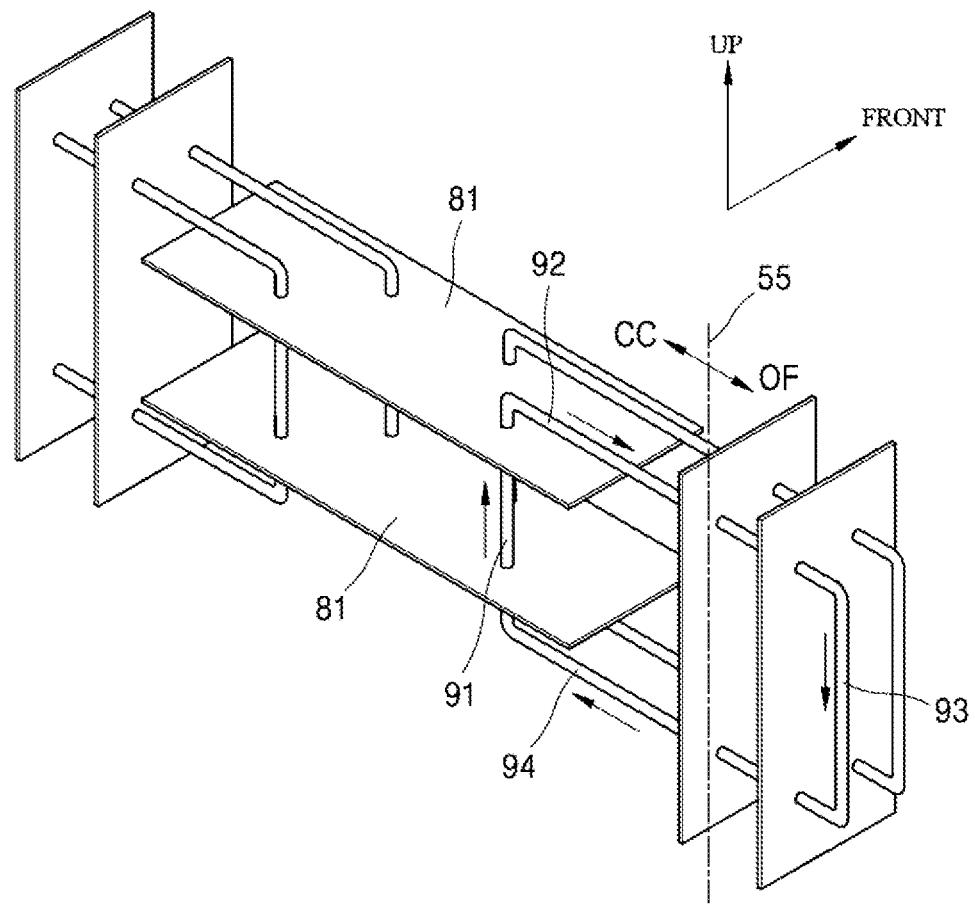
FIG. 19 is a perspective view of only a structure of a heat exchanger according to the fifth embodiment.

Referring to FIG. 16 or 19, according to the present disclosure, a heat exchanger that has a structure of a cooler includes a first pin 81 arranged in a closed air circulation pathway CC, a second pin 81 arranged in an open air flow pathway OF, and a circulating heat pipe 90 that connects the first pin 81 and the second pin 72 and accommodates a refrigerant.

In another embodiment of the present disclosure, the heat pipe is provided in a form of a circulating close loop instead of a bar that has one end and the other end thereof. The circulating heat pipe may have an evaporation section 91, a gas-phase section 92, a condensation section 93, and a liquid-phase section 94 according to a circulation order of the refrigerant.

The evaporation section of the circulating heat pipe is arranged in the CC. In order to enhance the heat transfer efficiency between the air circulating through the CC and the heat pipe, the first pin 81 may contact the evaporation section 91. For example, at least a part, of the heat pipe, in the evaporation section passes through the first pin and contacts the first pin. The first pins may have a form of a flat panel and a plurality of first pins are spaced apart from one another and are arranged.

A gas-phase section 92 is in a section of the heat pipe, in which the gas-phase refrigerant in the heat pipe evaporated by absorbing the heat in the evaporation section 91 passes through a compartment wall that divides the CC and the OF and is moved from the CC to the OF.

The condensation section 93 is arranged in the OF. In order to enhance the heat transfer efficiency between relatively cool air and the heat pipe that passes through the OF, the second pin 72 may contact the condensation section 93. For example, at least a part of the heat pipe in the condensing section passes through the second pin and contacts the second pin. The second pins may have the form of the flat panel and may have a structure in which a plurality of second pins are spaced apart from one another and arranged.

The liquid-phase section 94 is in a section of the heat pipe in which the liquid-phase refrigerant in the heat pipe that is condensed by generating the heat in the condensation section 93 passes through a compartment wall that divides the OF and the CC, and is moved from the OF to the CC.

According to the present disclosure, the heat exchanger is configured such that the heat pipe has a circulation structure and includes a portion in which the evaporation section 91 of the heat pipe extends vertically, and includes a portion in which the condensation section 93 extends vertically.

According to the structure in which the evaporation section 91 of the heat pipe extends vertically, the refrigerant evaporated by absorbing the heat in the heat pipe is vaporized so that the vaporized refrigerant has a less density than the liquid-phase refrigerant that is not vaporized yet at a surrounding of the vaporized refrigerant and the vaporized refrigerant is smoothly moved upward by buoyancy.

The vaporized refrigerant moves along the gas-phase section 92 and reaches the condensation section 93. The refrigerant which has been condensed by generating the heat to the air flowing through the OF in the condensation section and the condensed refrigerant has a greater density than that of the gas-phase refrigerant at the surrounding thereof and the condensed refrigerant smoothly moves downward due to a weight of the refrigerant.

The liquefied refrigerant moves along the liquid-phase section 94 and reaches the evaporation section 91 back. That is, according to the present disclosure, at least a part of the evaporation section 91 and at least a part of the condensation section 93 extend vertically, so that circulation of the refrigerant in the heat pipe is possible.

Accordingly, not only the capillary phenomenon but also the shape of the heat pipe in the evaporation section and the condensation section described above allows the refrigerant in the circulating heat pipe to circulate smoothly. According to the related art, a general structure of the heat pipe is not preferable for rapid heat transfer in that the gaseous refrigerant and the liquid-phase refrigerant move in opposite directions to each other in one pipe between one end at the high temperature and the other end at the low temperature. On the other hand, according to the present disclosure, the circulating heat pipe has a pathway 92 in which the gas-phase refrigerant is moved and a pathway 94 in which the liquid-phase refrigerant moves separately and has the pathway 92 and the pathway 94 so that the air circulate through the pathways, and the heat transfer may be performed very quickly.

Hereinafter, according to another embodiment of the present disclosure, a structure of a display device that has a structure of the heat exchanger will be described with reference to several embodiments.

Fourth Embodiment

Figure 14:
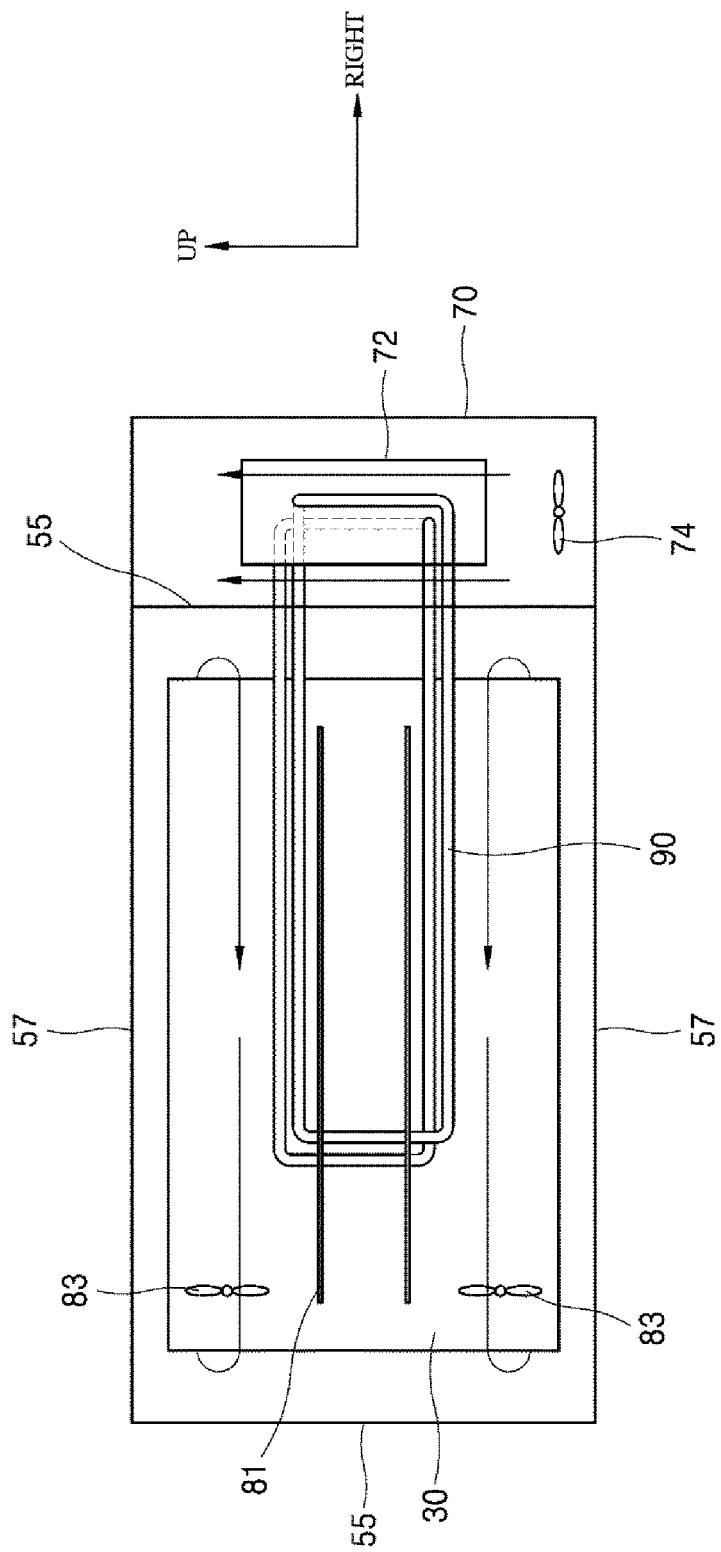
FIG. 14 is a rear view of a fourth embodiment of a display device to which a structure of a heat exchanger according to another embodiment of the present disclosure is applied.
Figure 15:
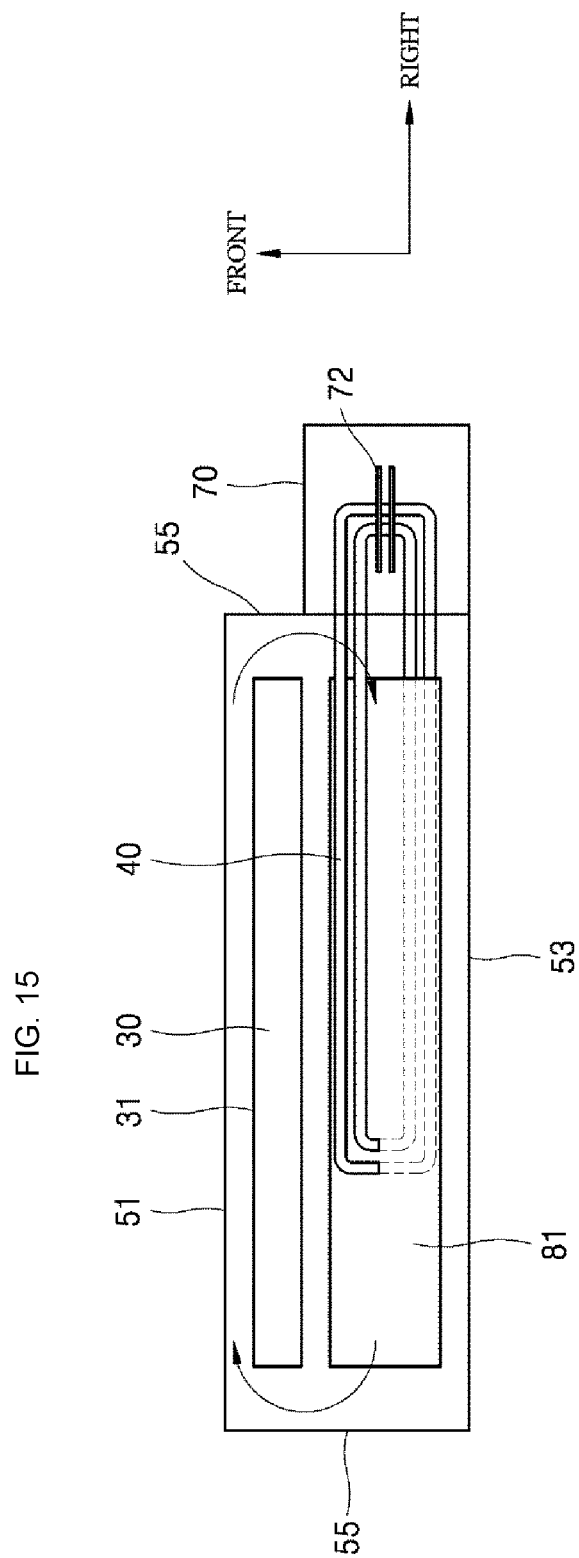
FIG. 15 is a plan view of the display device of FIG. 14.

FIG. 14 is a rear view of a display device that has a structure of a heat exchanger according to a fourth embodiment of the present disclosure, FIG. 15 is a plan view of the display device of FIG. 14, and FIG. 16 is a perspective view of only a structure of a heat exchanger of the fourth embodiment.

Referring to FIGS. 14 to 16, a closed air circulation pathway is provided in a space defined by a front plate 51, a rear plate 53 spaced apart from a rear of the front plate, a first plate 55 that connects the short sides in the left side and the short side in the right side of the front plate and the rear plate, and a second side plate 57 that connects the long side in the upper portion and the long side in lower side of the front plate and the rear plate. Specifically, the air flows, through the closed air circulation pathway, by a circulation fan 83 provided in the closed air circulation pathway, and circulates through the space between the front plate 51 and the display surface 31, a space between the side of the display unit 30 and the side plate 55, and a space between the rear of the display unit 30 and the rear plate 53 of the housing. The air circulating through the space absorbs the heat generated from the display unit or the electronics thereof and circulates through the path.

A thin and elongated rectangular first pin 81 is arranged in a space between a rear portion of the display unit and the rear plate 53 of the housing in the closed air circulation pathway. The first pin 81 has the form of the flat panel which is perpendicular to a vertical axis, and have a structure in which a plurality of first pins 81 are spaced apart from one another along the vertical axis and are arranged. As show in FIGS. 14 to 16, only two of the first pins 81 are shown for convenience of understanding. A number and an interval of the first pins may be changed within a range in which the heat exchange of the circulating air with the first pin is smoothly made while not excessively interfering with the air circulation.

A vertically extending circulation heat pipe 90 passes through the first pin 81. That is, the heat pipes that pass through the first pin contact the first pin. Thus, the heat of the first pin is transferred to the heat pipe very quickly. The vertically extending part, of the heat pipe, through which the first pin passes is included in the evaporation section 91. As shown in FIGS. 14 to 16, only two heat pipes are shown for convenience of understanding, and a number of the heat pipes and an interval at which the heat pipes are installed may be appropriately selected in consideration of heat transfer efficiency and space required for exchanging the heat. In the fourth embodiment, the positions at which the heat pipe passes through the first pin are arranged in a row in parallel with one another at predetermined intervals along a center of a vertically extending line of the first pin. Such positions, of the first pin, through which the heat pipe passes and an arrangement of the first pins may be appropriately selected in consideration of the heat transfer efficiency and space required for exchanging the heat, smooth flow of refrigerant in the heat pipe, and the like.

An open air flow pathway is provided on the first side plate 55 at either side of the left and right sides of the display device. In the fourth embodiment, although the open air flow pathway is provided only at one side of the display device, it may be provided at both sides of the display device in the fifth embodiment described below, if necessary. The OF may be defined by the duct 70 extending along a longitudinal direction (i.e., a vertical direction) of the first side plate 55. The duct 70 is provided in such a manner that air communicates vertically and a flow fan 74 is provided at an upper end or a lower end of the duct to cause a flow in which air moves upward or downward in the duct. FIG. 14 illustrates a structure in which a flow fan 74 is provided at a lower portion of the duct.

A thin and elongated rectangular second pin 72 is arranged in the open air flow pathway in the duct. The second pin 72 has a form of a flat panel perpendicular to a forward and rearward axis, and has a structure in which a plurality of second pins 72 are spaced apart from one another along the forward and rearward axis and are arranged. As shown in FIGS. 14 to 16, only two of the second pins 72 are shown for convenience of understanding. A number and an interval of the second pins may be changed within a range in which the heat exchange of the flowing air with the second pin is smoothly made without excessively interfering with the air circulation.

The heat pipe 90 extends from an upper portion of the evaporation section 91 toward the open air flow pathway and the air passes a gas-phase section 92 in the open air flow pathway through the first side plate 55. The condensation section 93 extending from the gas-phase section 92 which reached the open air flow pathway passes through the second pin 72 in the forward and rearward direction thereof and extends vertically. That is, the heat pipes that pass through the second pin contact the second pin at the portion in which the heat pipe passes through the second pin. Thus, the heat of the heat pipe is quickly transferred to the second pin.

The plurality of heat pipes that pass through the second pin are evenly distributed in an area of the second pin. To this end, the plurality of heat pipes are configured such that their positions, of the plurality of heat pipes, that pass through the second pin 72 are set to be different from one another, and the portion different from another portion that passes through the second pin 72 extends vertically.

The circulating heat pipe 90 extends from a lower portion of the condensation section 93 toward the closed air circulation pathway and includes a liquid-phase section 94 that is connected to a lower end of the vaporization section 91 in the closed air circulation pathway through the first side plate 55.

Fifth Embodiment

Figure 17:
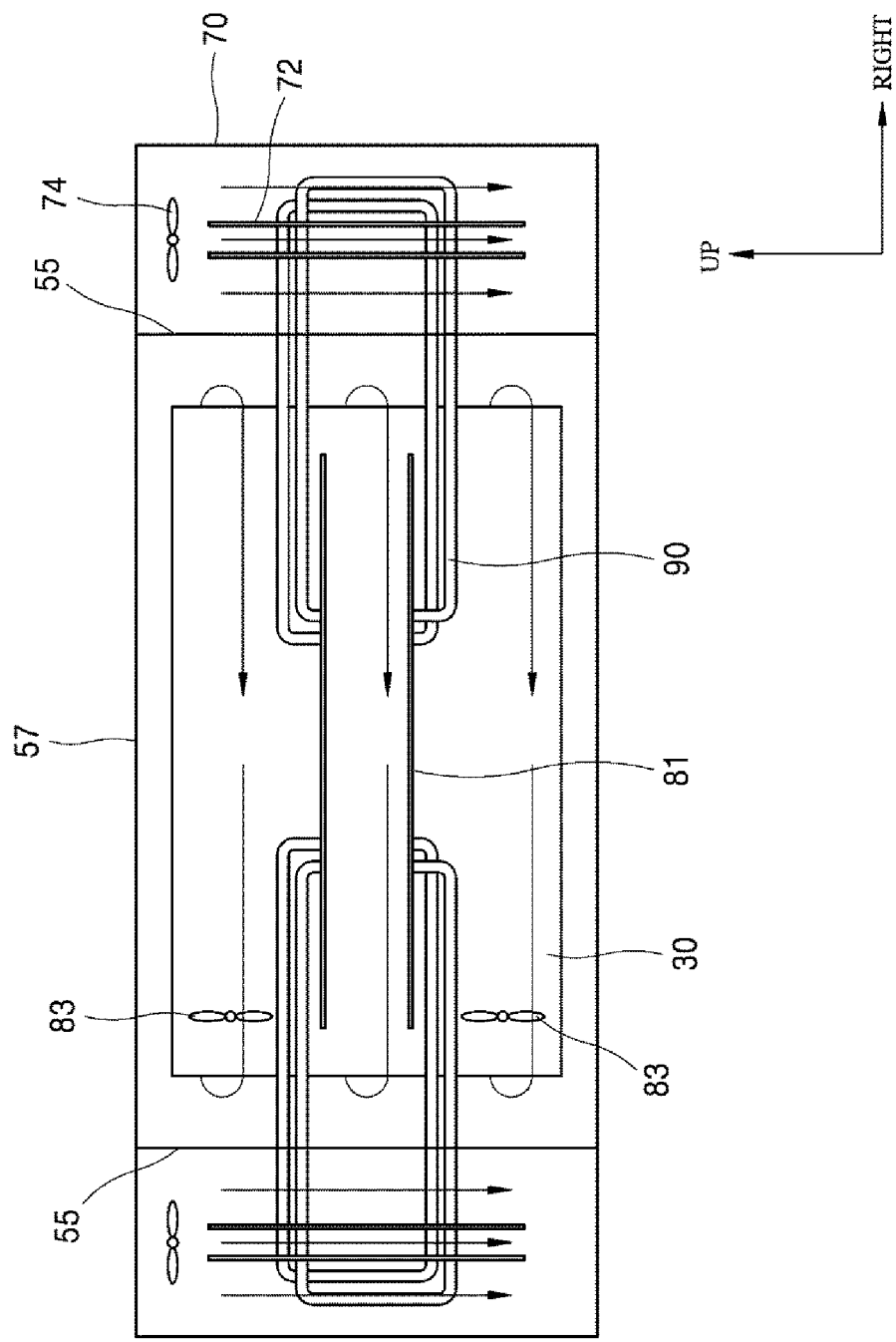
FIG. 17 is a rear view of a fifth embodiment of a display device that has a structure of a heat exchanger according to the present disclosure.
Figure 18:
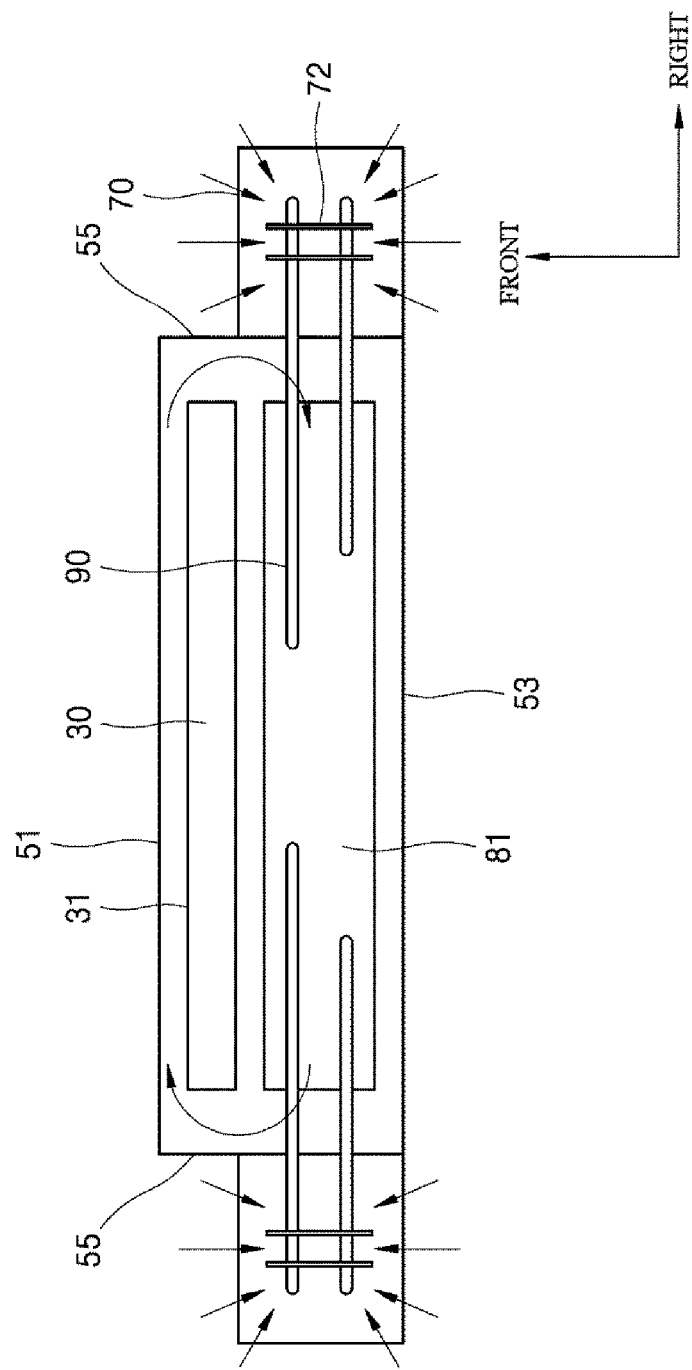
FIG. 18 is a plan view of the display device of FIG. 17.

FIG. 17 is a rear view of a display device that has a structure of a heat exchanger according to a fifth embodiment of the present disclosure. FIG. 18 is a plan view of the display device of FIG. 17. FIG. 19 is a perspective view of only a structure of a heat exchanger according to the fifth embodiment.

Referring to FIGS. 17 to 19, a closed air circulation pathway and an open air flow pathway are not different from those described in the fourth embodiment. An arrangement or a structure of the heat exchanger is slightly different from the arrangement or the structure of the heat exchanger described in the fifth embodiment and this difference will be mainly described. First, in the cooling structure according to the fifth embodiment, an open air flow pathway is provided on the first side plate 55 at both the left and right sides of the display device. The first pins, the second fins, and the circulating heat pipes have a bilateral symmetric shape, respectively.

A thin and elongated rectangular first pin 81 is arranged in the closed air circulation pathway. The first pin 81 has a form of a flat panel that is perpendicular to a vertical axis, and a plurality of first pins 81 are spaced apart from one another and are arranged in the vertical axis.

An evaporation section 91 of a circulating heat pipe 90 extends vertically and passes through the first pin 81. In the fifth embodiment, the position at which the heat pipe passes through the first pin is provided forward and rearward by the predetermined intervals and is provided laterally by the predetermined intervals. Thus, as a gas-phase section 92 extends from the two evaporation sections 91, respectively, to the open air flow pathway and the two evaporation sections 91 and the gas-phase section 92 are appropriately distributed so as not to be overlapped with one another.

A thin and elongated rectangular second pin 72 is arranged in the open air flow pathway in the duct. The second pin 72 has the form of the flat panel which is perpendicular to a lateral axis, and the plurality of second pins 72 are spaced apart from one another along the lateral direction of the second pin 72 and are arranged.

The condensation section 93 of the heat pipe 90 extends laterally and passes through the second pin 72 and extends vertically. More specifically, the condensing section 93 of the heat pipe includes a portion that extends from the closed air circulation pathway in a direction away from the closed air circulation pathway and passes through the second pin in the lateral direction thereof, a portion in which the heat pipe that passes through the second pin extends vertically, and a portion that extends from a lower end of the heat pipe extending vertically to a direction of closing to the closed air circulation pathway, and the heat pipe passes through the second pin in the lateral direction thereof and is fixed to the second pin. That is, one heat pipe passes through the second pin twice.

The liquid-phase section 94 of the circulating heat pipe 90 extends from the condensing section 93 toward the closed air circulation pathway to pass through the first side plate 55, and is connected to a lower end of the evaporation section 91 in the closed air circulation pathway.

In the fifth embodiment, as a less portion where the heat pipe is bent enables the circulation in the refrigerant to flow through the heat pipe to be smoothly made as compared to the fourth embodiment.

Sixth Embodiment

Figure 20:
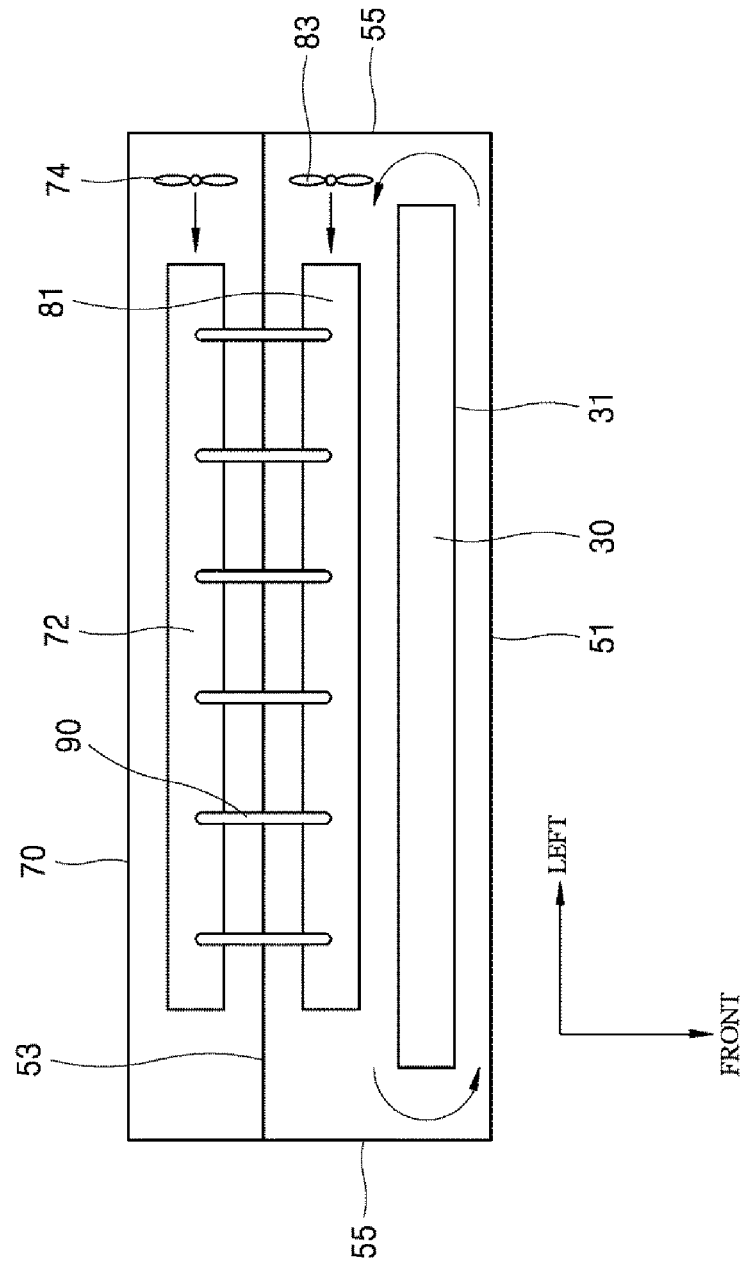
FIG. 20 is a plan view of a sixth embodiment of a display device that has a structure of a heat exchanger according to the present disclosure.
Figure 21:
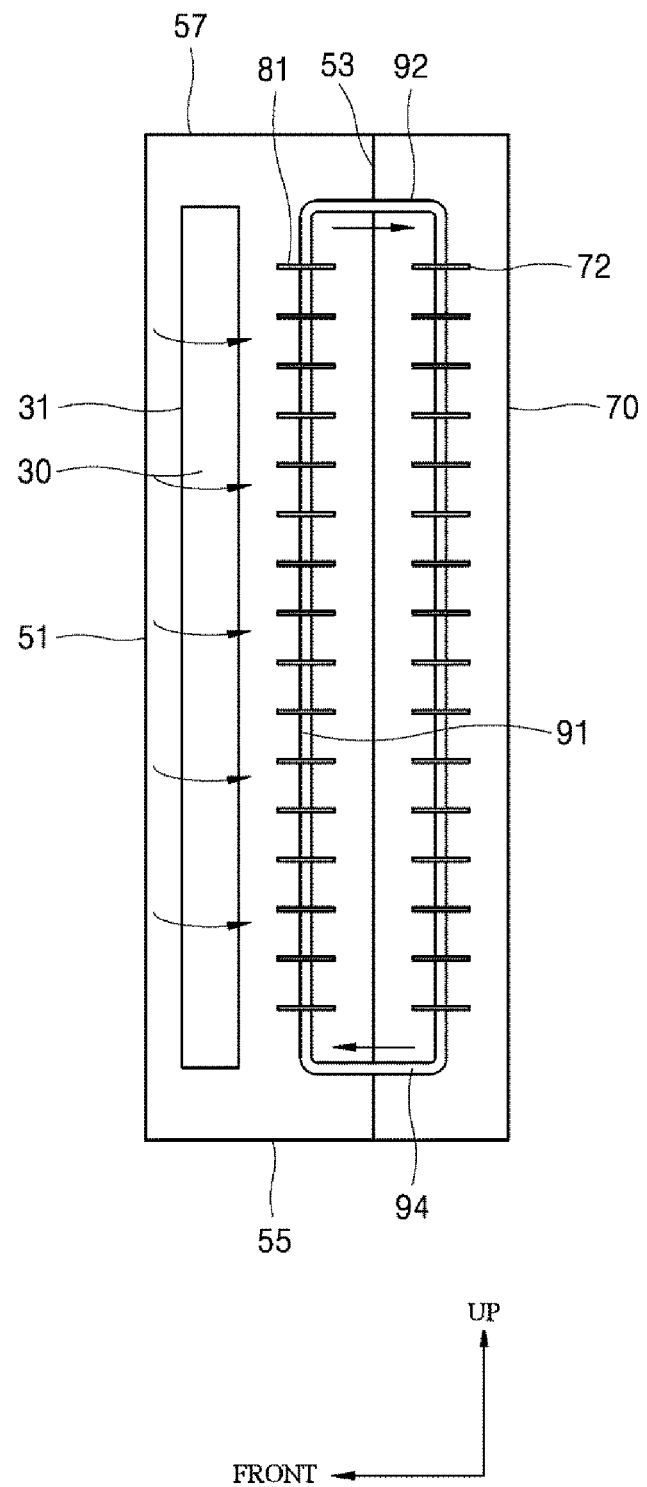
FIG. 21 is a side view of the display device of FIG. 20.

FIG. 20 is a plan view of a display device that has a structure of a heat exchanger according to a sixth embodiment of the present disclosure. FIG. 21 is a side view of the display device of FIG. 20.

Referring to FIGS. 20 and 21, in the sixth embodiment, unlike the first and fifth embodiments, an open air flow pathway is arranged rearward of the display unit 30 and rearward of a closed air circulation pathway. According to the present disclosure, as the air flowing through the open air flow pathway the air flowing through the closed air circulation pathway contacts and perform the heat exchange but has a structure of the heat exchange in which the heat is transferred by the heat pipe, it is not required for the open air flow pathway to be arranged rearward of the display unit and inward of a loop of the closed air circulation pathway.

As shown in the figures, the air in the closed air circulation pathway flows in a lateral direction thereof and circulates by a circulating fan 83 in a space forward and rearward of the display unit. Further, the air in the OF flows laterally by the flowing fan 74 in the duct 70 provided rearward of the closed air circulation pathway.

A thin and elongated rectangular first pin 81 is arranged in the space between the rear of the display unit and the rear plate 53 of the housing in the closed air circulation pathway. The first pin 81 has the form of a flat panel which is perpendicular to a vertical axis, and a plurality of first pins 81 are spaced apart from one another vertically and are arranged.

A second pin 72 that has a thin and elongated rectangular shape is arranged in the open air circulation pathway. The second pin 2 has the form of the flat panel which is perpendicular to a vertical axis and has a structure in which a plurality of second pins 72 are spaced from one another vertically and are arranged.

The evaporation section 91 of the circulation heat pipe 90 is vertically passes through the first pin 81. The gas-phase section 92 extends from an upper portion of the evaporation section 91 to the second pin 72 through the rear plate 53 of the housing. The condensation section 93 vertically passes through the second pin 72. The liquid-phase section 94 extends from the lower portion of the condensation section 93 to the lower portion of the evaporation section 91 through the rear plate 53 of the housing.

According to the sixth embodiment, a dimension of left-right direction of the display device may be reduced, and the short gas-phase section and the liquid-phase section of the heat pipe may be formed, and the circulating heat pipe may be simply configured.

Seventh Embodiment

FIG. 22 is a plan view of a display device that has a structure of a heat exchanger according to a seventh embodiment of the present disclosure.

In comparison to the sixth embodiment, in the seventh embodiment shown in FIG. 22, in order to reduce a dimension of front-rear direction of the display unit, a second pin in the open air flow pathway provided rearward of the closed air circulation pathway is arranged so as not be overlapped with the first pin provided in the closed air circulation pathway in a thickness direction (forward and rearward direction) of the display device. Further, as shown in FIG. 22, the first pin is provided in a separate space from the second pin, it is easier to arrange the first pin and the second pin so that the first pin and the second pin do not overlap in the thickness direction of the display device. According to this structure, the thickness of the display device may be increased or an increase in thickness of the display device may be minimized.

Then, the rear plate 53 of the housing at which the first pin is adjacent to the second pin includes an inclined surface to facilitate the air flow in the two paths (CC and OF). Thus, even though changes in a cross-sectional area where the air flows between the two paths where the air moves, the inclined surface enables guiding the air flow so that the air circulates and flows smoothly.

The feature that the first pin and the second pin that has the shape of the flat panel perpendicular to the vertical axis are spaced apart from one another vertically and are arranged, and a structure of the circulating heat pipe 90 that passes through the first pins and the second pins, through which the air circulates, are similar to a sixth embodiment, except that the sixth embodiment provides that the plurality of heat pipes pass through one wide first pin or second pin, while the seventh embodiment provides that the heat pipe passes through a plurality of small first pins or second pins, respectively. The repetitive description thereof will be omitted.

In the first to seventh embodiments as described above, the heat pipe 90 and the pin 81 of the heat exchanger are arranged over the space of the CC. However, the structures of the heat pipe and the pin may be provided in a part different from another part in which other components of the display device are provided in consideration of a volume occupied by the other components of the display device. Further, the heat pipe 90 and the pin 81 may be arranged so as to be closer to an internal component in which a large amount of heat is generated, so that the heat of the space is absorbed more concentrically.

Hereinafter, according to the present disclosure, cooling of the display device using the heat exchanger will be described.

When the display device is operated, the heat is generated in the display unit and a chip of a PCB installed rearward of the display unit. The circulating fan 83 and the flow fan 74 cause the air circulation of the CC and air flow in the OF, respectively.

The air absorbs the heat generated from the display unit and the accessories thereof and circulates through the CC and the air contacts the first pin disposed rearward of the display unit and the heat generated from the display unit and the accessories thereof is transferred to the first pin. The heat of the first pin 81 is transferred to the evaporation section 91 of the heat pipe 90, and the refrigerant in the heat pipe is evaporated due the heat absorbed into the heat pipe and the refrigerant ascends by the buoyancy. As the refrigerant evaporates, an amount of heat absorbed by the refrigerant is further increased by absorbing the heat of vaporization. The vaporized refrigerant moves through the gas-phase section 92 to the OF. That is, the heat absorbed into the CC is quickly transferred to the second pin in the OF by conduction of the heat pipe itself and the vaporized refrigerant in the heat pipe.

As a temperature of the air flowing through the OF is lower than the temperature of the condensation section 93 of the heat pipe and the second pin 72, the gaseous refrigerant in the condensation section 93 transfers the heat to the air in the OF through the second pin and the refrigerant is condensed to generate a condensation heat, thereby transferring a larger amount of heat to the air in the OF.

On the other hand, the condensed refrigerant rapidly descends by the weight of the refrigerant and returns back to the evaporation section 91 of the CC through the liquid-phase section 94.

Accordingly, according to another embodiment of the present disclosure, the display device that has the structure of the heat exchanger may also perform highly efficient cooling. The heat exchanger may occupy a less volume and may perform the efficient heat exchange, thereby designing a compact and slim display device.

While the present disclosure has been described with reference to exemplary drawings thereof, it is to be understood that the present disclosure is not limited to the embodiments and the drawings disclosed in the present disclosure, it will be understood that various modifications may be made by those skilled in the art within the scope of the technical idea of the present disclosure. Although the working effects obtained from the configuration of the present disclosure is explicitly described in the description of the embodiments of the present disclosure, an effect predictable from the configuration has to be recognized.

The invention claimed is:

1. A heat transfer system for a display device having a display unit, comprising:
   a closed air circulation pathway that surrounds the display unit and through which internal air circulates;
   an open air flow pathway adjacent to the closed air circulation pathway and through which external air flows;
   a circulation pipe containing a refrigerant, wherein a first end section of the circulation pipe is provided in the closed air circulation pathway, and a second end section of the circulation pipe is provided in the open air flow pathway; and
   a first fin that is arranged in the closed air circulation pathway and through which the first end section of the circulation pipe passes,
   wherein the first fin is spaced apart from the display unit, and the first fin is configured to absorb heat from the internal air that circulates through the closed air circulation pathway.

2. The heat transfer system for the display device of claim 1, further comprising a circulation fan that circulates the internal air through the closed air circulation pathway, the circulation fan being provided at at least one of a side space or a rear space of the display unit in the closed air circulation pathway.

3. The heat transfer system for the display device of claim 1, further comprising a flow fan provided in the open air flow pathway spaced apart from the circulation pipe and configured to circulate the external air flowing through the open air flow pathway.

4. The heat transfer system for the display device of claim 1, wherein the open air flow pathway is provided along a side of the display unit, wherein the open air flow pathway is arranged inside or outside of an area surrounded by the closed air circulation pathway, or wherein the open air flow pathway is staggered with the closed air circulation pathway from the display unit outward.

5. The heat transfer system for the display device of claim 1, further comprising a duct provided at a side of the display unit, wherein the external air moves from the open air flow pathway to a flow pathway provided in the duct.

6. The heat transfer system for the display device of claim 1, wherein the open air flow pathway is provided behind both the display unit and a rear space of the closed air circulation pathway.

7. The heat transfer system for the display device of claim 1, wherein the first fin is formed as a plate which is parallel to an air flow direction of the closed air circulation pathway, and wherein a plurality of first fins are spaced apart from one another in a direction perpendicular to the air flow direction of the closed air circulation pathway.

8. The heat transfer system for the display device of claim 1, further comprising a second fin provided in the open air flow pathway, wherein the second end section of the circulation pipe provided in the open air flow pathway passes through the second fin, and wherein the second fin is formed as a plate that is parallel to an air flow direction of the open air flow pathway, and wherein a plurality of second fins are spaced apart from one another in a direction perpendicular to the air flow direction of the open air flow pathway.

9. The cooler for the display device of claim 8, wherein the circulation pipe comprises a plurality of circulation pipes and the first fin comprises a plurality of first fins, and
   wherein each of the plurality of circulation pipes extends substantially parallel to a longitudinal direction of the plurality of first fins, respectively, and each of the plurality of circulation pipes is in continuous contact with a respective first fin along the longitudinal direction thereof.

10. A display device, comprising:
   a casing;
   a display panel accommodated in the casing and spaced apart from the casing to define a closed air circulation path;

a duct attached to the casing and defining an open air flow path that is separate from the closed air circulation path;

a plurality of first fins provided in the casing, the plurality of first fins being spaced apart from the display panel;

a plurality of second fins provided in the duct; and at least one circulation pipe containing a refrigerant, wherein a first end section of the at least one circulation pipe passes through the plurality of first fins, and a second end section of the at least one circulation pipe passes through the plurality of second fins.

11. The display device of claim 10, further comprising:

at least one circulation fan provided in the casing and configured to circulate air around the display panel; and at least one flow fan provided in the duct and configured to circulate external air over the plurality of second fins.

12. The display device of claim 10, further comprising a circuit board provided in the duct and electrically connected to the display panel through the casing.

13. The display device of claim 10, wherein the at least one circulation pipe is configured such that the refrigerant transfers heat from the plurality of first fins to the plurality of second fins.

14. The display device of claim 10, wherein a flow direction of external air through the duct is perpendicular to a flow direction of circulated air in the casing.

15. The display device of claim 10, wherein the closed air circulation path comprises a first path between the display panel and a rear panel of the casing, and wherein a flow direction of external air through the duct is opposite to a flow direction of the circulated air in the first path, the duct being adjacent to the first path.

* * * * *